(12) United States Patent
Takano

(10) Patent No.: US 6,908,797 B2
(45) Date of Patent: Jun. 21, 2005

(54) METHOD OF MANUFACTURING A SEMICONDUCTOR DEVICE

(75) Inventor: Tamae Takano, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 90 days.

(21) Appl. No.: 10/614,110

(22) Filed: Jul. 8, 2003

(65) Prior Publication Data

US 2004/0023444 A1 Feb. 5, 2004

(30) Foreign Application Priority Data

Jul. 9, 2002 (JP) ......................................... 2002-200555

(51) Int. Cl.⁷ .............................................. H01L 21/00
(52) U.S. Cl. ........................ 438/149; 438/486; 438/487; 438/488; 438/502; 438/509; 438/166; 438/482; 438/479; 438/471
(58) Field of Search ................................. 438/149, 486, 438/487, 488, 502, 509, 166, 482, 479, 471

(56) References Cited

U.S. PATENT DOCUMENTS

| | | | | |
|---|---|---|---|---|
| 5,639,698 A | * | 6/1997 | Yamazaki et al. | 438/486 |
| 6,218,219 B1 | * | 4/2001 | Yamazaki et al. | 438/149 |
| 6,348,368 B1 | * | 2/2002 | Yamazaki et al. | 438/166 |
| 6,365,933 B1 | | 4/2002 | Yamazaki et al. | |
| 6,455,401 B1 | * | 9/2002 | Zhang et al. | 438/486 |
| 6,692,996 B2 | * | 2/2004 | Lee et al. | 438/149 |
| 6,703,265 B2 | * | 3/2004 | Asami et al. | 438/150 |
| 6,808,965 B1 | * | 10/2004 | Miyasaka et al. | 438/151 |
| 2001/0019859 A1 | * | 9/2001 | Yamazaki et al. | 438/149 |
| 2001/0023089 A1 | * | 9/2001 | Yamazaki et al. | 438/142 |

FOREIGN PATENT DOCUMENTS

| | | |
|---|---|---|
| JP | 10-135468 | 5/1998 |
| JP | 10-135469 | 5/1998 |

OTHER PUBLICATIONS

Sato et al., "Mobility Anisotropy of Electrons in Inversion Layers on Oxidized Silicon Surfaces," Physical Review B4, 1971, pp. 1950–1960.

* cited by examiner

Primary Examiner—Matthew Smith
Assistant Examiner—Belur V Keshavan
(74) Attorney, Agent, or Firm—Eric J. Robinson; Robinson Intellectual Property Law Office

(57) ABSTRACT

The present invention provides a manufacturing method of a semiconductor device, which is able to improve on-current and mobility of a polycrystal TFT without disturbing a high integration level, and also provide a semiconductor device obtained in accordance with the manufacturing method. The manufacturing method comprises steps of adding a catalytic element to a semiconductor film and heating the semiconductor film to form a more crystallized first region; forming a less crystallized second region than the first region; irradiating first laser light to the first region to form a more crystallized third region than the first region; irradiating second laser light to the second region to form a more crystallized fourth region than the second region; and patterning the third region to form a first island-shaped region and the fourth region to form a second island-shaped region, wherein the first laser light has the same energy density from the second laser light, and a scan speed of the first laser light is faster than that of the second laser light.

30 Claims, 16 Drawing Sheets

| Scan Speed | Inverse Pole Figure | Orientation Ratio |
|---|---|---|
| 2cm/sec | | {100}: 8.1%<br>{110}: 4.9%<br>{111}: 2.0% |
| 3cm/sec | | {100}: 7.9%<br>{110}: 4.2%<br>{111}: 1.9% |
| 20cm/sec | | {100}: 9.2%<br>{110}: 8.8%<br>{111}: 1.7% |
| 50cm/sec | | {100}: 3.4%<br>{110}: 9.1%<br>{111}: 2.0% |
| 90cm/sec | | {100}: 1.5%<br>{110}: 15.7%<br>{111}: 1.1% |

Fig.4A
Fig.4B
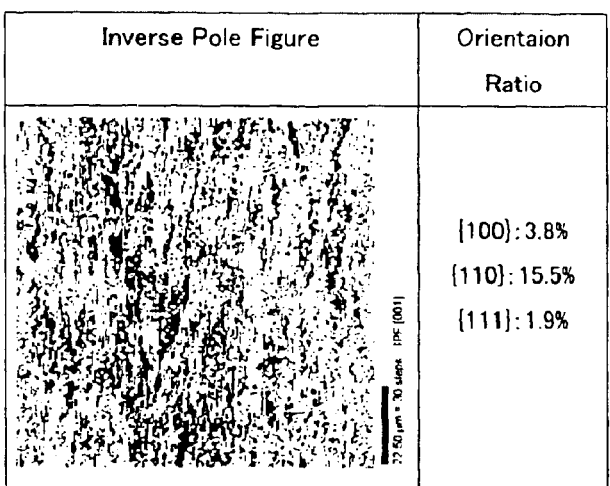
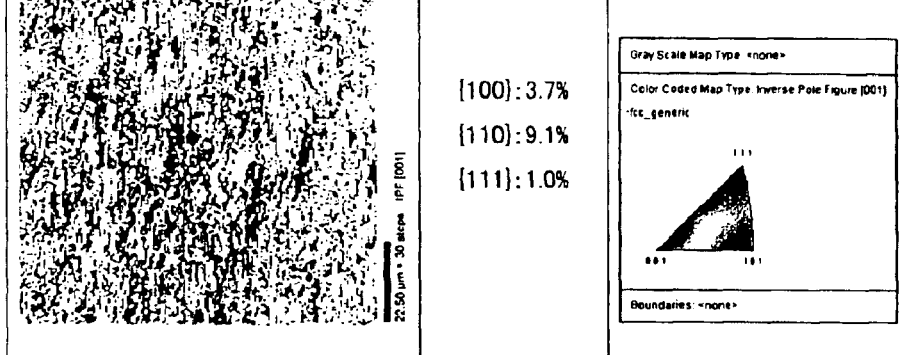

p-type region ⇔ n-type region p-type region ⟵ | ⟶ n-type region

Fig.9A
Fig.9B
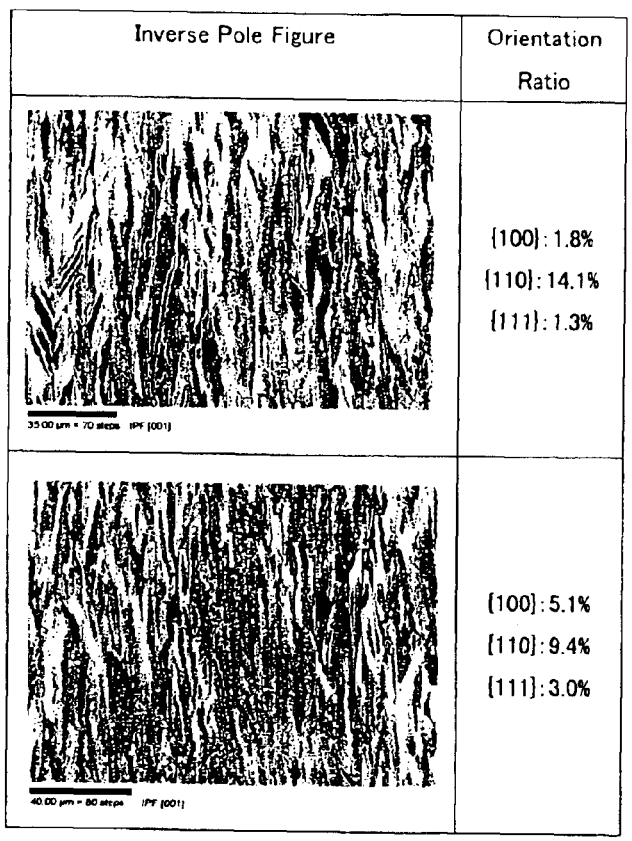
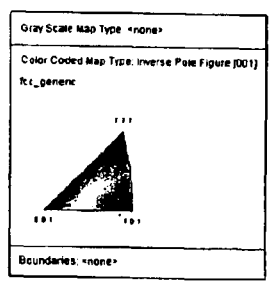

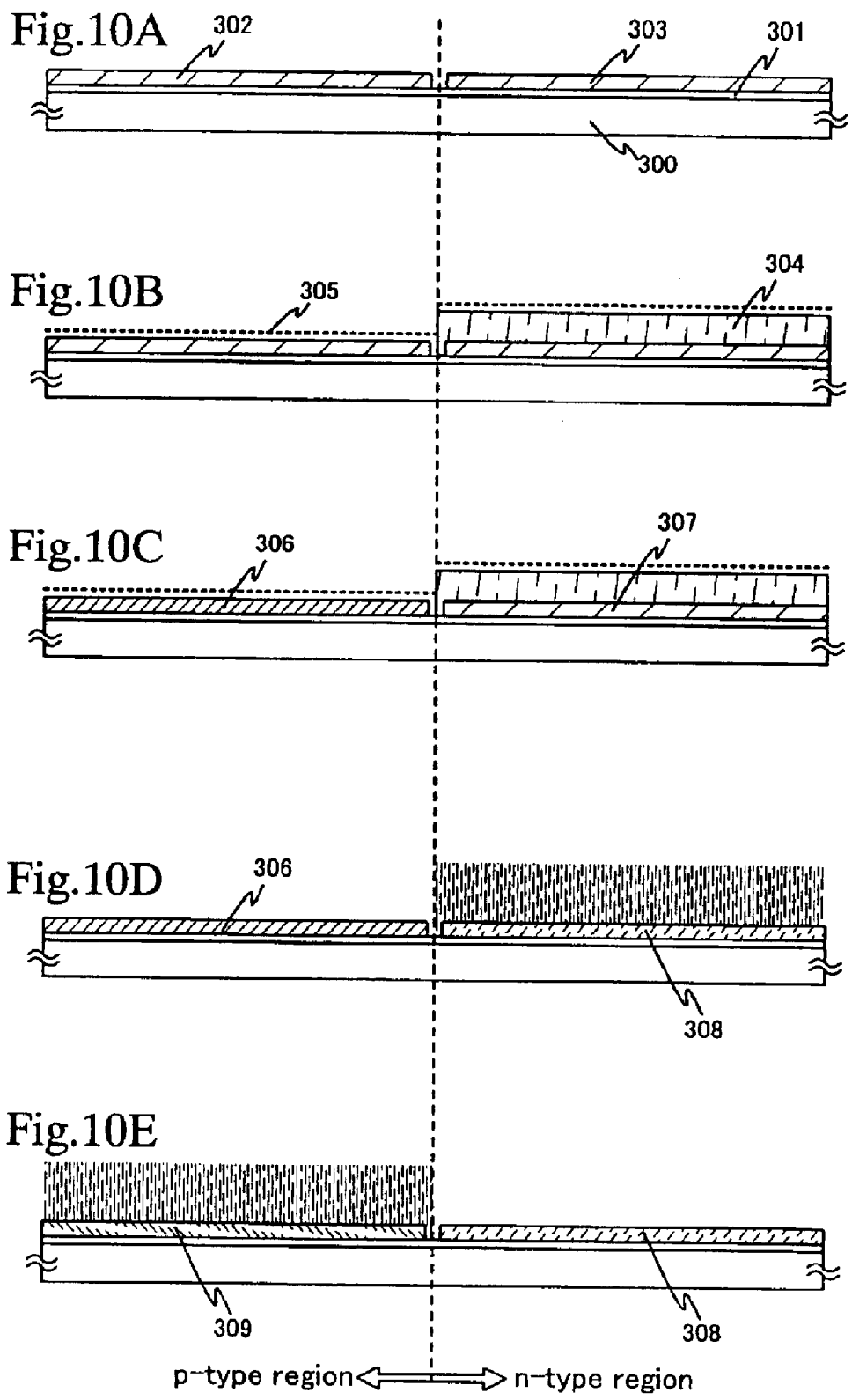

p-type region ⟵⟶ n-type region

Scanning Diredtion of Laser Light →

Scanning Diredtion of Laser Light →

1405  1402  1401  1403

METHOD OF MANUFACTURING A SEMICONDUCTOR DEVICE

BACKGROUND OF THE INVENTION

1. Field of the Invention

The present invention relates to a method of manufacturing a semiconductor device that has a semiconductor element, typically a thin film transistor (TFT), that has a semiconductor film crystallized on an insulating surface.

2. Description of the Related Art

In electronic devices such as a television, a personal computer, and a cellular phone, a display for displaying characters or images is indispensable as a means for recognizing information. In these days especially, a flat-type semiconductor display device (flat panel display), represented by a liquid crystal display device that utilizes the electro-optical character of liquid crystal, has actively been used.

An active matrix driving method is known as one mode in the flat panel display. In the active matrix driving method, a TFT is provided in each pixel and image signals are in order written to perform a display of an image. The TFT is an essential element for realizing the active matrix driving method.

Although most TFTs were manufactured of an amorphous semiconductor films, electric field effect mobility (hereinafter, referred to a mobility) was low and it was impossible to operate the TFTs in accordance with frequency necessary for processing image signals. Therefore, the TFTs were used only as a switching element provided in each pixel. A gate line driving circuit for selecting pixels and a source line driving circuit for inputting image signals into the selected pixels were externally provided with IC (driver IC) prepared by TAB (Tape Automated Bonding) and COG (Chip on Glass).

As pixel density is higher, however, pixel pitch is narrower. Therefore, it is considered that the method of providing the drive IC has limit. For example, in the case of UXGA (pixel number: 1200×1600) supposed, 6000 connection terminals are necessary in RGB color method if an estimate is simply made. The increase of the number of connection terminals causes contact defects to increase and the occurrence probability of the contact defects increase as a result. Further, since a region of a periphery portion outside a pixel portion (frame region) increases, it is difficult to miniaturize a semiconductor device that has the above frame region and the design of appearances of the semiconductor device is spoiled.

Considering the above background, it is obvious that a semiconductor device provided with driving circuit in a body is necessary. When a pixel portion, a gate line driving circuit, and a source line driving circuit are formed together on the same substrate, in short, system-on-panel is realized, the number of connection terminals is sharply decreased and it is possible to reduce an area of the frame region.

As a means of realizing the system-on-panel, a method of forming a TFT of a polycrystal semiconductor film is proposed. Since the TFT of the polycrystal semiconductor film (polycrystal TFT) has higher mobility compared to a TFT formed of an amorphous semiconductor film, it is possible to operate the polycrystal TFT in accordance with frequency necessary for handling image signals. Therefore, when the polycrystal TFT is used, it is possible to realize a semiconductor device provided with a diver circuit, which has a pixel portion, a gate line driving circuit, and a source line driving circuit formed on the same substrate in a body.

SUMMARY OF THE INVENTION

It is possible that a semiconductor device has a controller, a CPU, and so on provided in addition to driver circuits such as a gate line driving circuit and a source line driving circuit. Then, it has been tried recently to form a controller and a CPU, which used to be formed from a single crystal silicon substrate, on a glass substrate together with driver circuits. In the same way as the driver circuits, it is possible to suppress the size of a semiconductor device remarkably and to improve tolerance against physical impact more if it becomes possible to form the controller and the CPU on the same substrate together with the pixel portion.

However, characteristics of the polycrystal TFT were not equal to characteristics of a MOS transistor (single crystal transistor) formed on a single crystal silicon substrate after all. Due to existence of a defect in an interface between crystal grains (grain boundary), on current and mobility of the characteristics were especially inferior to the single crystal transistor. Note that the grain boundary, which also refers to a crystal grain boundary, is one of lattice defects and classified into a plane defect. Although the plane defect includes twin crystal plane and stacking fault in addition to the grain boundary, an electrically active plane defect which has dangling bond, that is, the grain boundary and the staking fault generically refers to a grain boundary in the present specification.

Therefore, the mobility is not enough to obtain sufficient on current and the operation speed is insufficient when it is tried to manufacture integrated circuits such as a controller and a CPU from polycrysal TFTs.

As a means for increasing on current, a method in which the ration of channel width W to channel length L (W/L) is made larger is given. It is, however, limited to reduce the size of the channel length L in terms of accuracy in an exposure technique. Further, considering wiring resistance, it is indispensable that an integration level is high to some extent in integrated circuits such as a controller and a CPU, and therefore it is limited to arrange the layout of TFTs and wirings and it is not easy to extend the channel width W. Accordingly, it was limited to control W/L and it was difficult with only the control of W/L to acquire enough on current.

Further, as another means for increasing on current, a method in which an orientation of a crystal is controlled in a channel-forming region of a transistor is given. In "Mobility Anisotropy of Electrons in Inversion Layers on Oxidized Silicon Surfaces, Tai Sato, Yoshiyuki Takeishi, and Hisashi Hara, Physical REVIEW B4 (1971) 1950–1960", it has already been reported that mobility depends on an orientation of a crystal and how to depend is different in accordance with a polarity. However, in the above reference, only the case of single crystal silicon is disclosed, and it is not mentioned how to apply to a TFT.

The present invention provides a technique for solving the above problem. It is an object of the present invention to provide a method of manufacturing a semiconductor device, which enables to improve on current and mobility of the polycrystal TFT without hindering high integration level.

The inventor of the present invention paid attention to the facts that, in the case of a TFT, mobility depends on an orientation of crystals existing in a semiconductor film and how to depend is different in accordance with a polarity of the TFT.

In FIG. 1A, measured data shows the relation between the orientation and the mobility in a channel-forming region of an n-channel TFT. In FIG. 1B, measured data shows the relation between the orientation and the mobility in a channel-forming region of a p-channel TFT. It is noted that L/W is 6/4 µm in both the n-channel and p-channel TFTs. Further, data of the mobility more than 250 m²/V·sec is plotted in FIG. 1A and data of the mobility more than 195 m²/V·sec is plotted in FIG. 1B since the mobility is influenced by the grain boundary more than the orientation in the case of a small grain size.

In FIG. 1A, it is shown that, in the case of the n-channel TFT, the mobility is higher as an angle from {100} plane is smaller, that is, a crystal plane in the vicinity of an interface of a gate insulating film approaches to {100} plane. The correlation coefficient in FIG. 1A is 67%. In FIG. 1B, it is shown that, in the case of the p-channel TFT, the mobility is higher as the angle from {110} plane is smaller. The correlation coefficient in FIG. 1B is 24%.

From the above, in the n-channel TFT, the mobility to a minority carrier (an electron here) takes the highest value in the case that the vicinity of the interface of the gate insulating film in the channel-forming region, in which an inversion layer is formed, is {100} plane. In the p-channel TFT, the mobility to a minority carrier (a hole here) takes the highest value in the case of {110} plane. It is understood that it is different in accordance with the polarity how the mobility depends on the orientation.

The inventor of the present invention tried to optimize a crystallization process in order to obtain many crystals with a suitable plane direction for each of an n-channel TFT and a p-channel TFT on the same substrate. The optimization of the crystallization process is that a scan speed of laser light for crystallization is controlled and it is selected if thermal crystallization with a catalytic element is performed or not. Then, there is provided a method of a semiconductor device for controlling the existence ratio of {100} plane and {110} plane in a crystal plane of a semiconductor film in the vicinity of an interface of an insulating film.

It is noted that, in the specification, the semiconductor device indicates a category of general devices which function by utilizing semiconductor characteristics, and a liquid crystal display device, a semiconductor display device represented by a light emitting device which uses a light emitting element, a semiconductor integrated circuit (a micro processor, a signal processing circuit, or a high frequency circuit), are all included in the category of the semiconductor device.

In FIG. 2, a mapping figure of an inverse pole figure of a plane direction, in a crystal plane in a horizontal direction to a substrate in a semiconductor film crystallized by irradiation of laser light, is shown for each scan speed. In FIG. 2, samples to which laser light is scanned in the horizontal direction to the substrate are used. In irradiating laser light, continuous emission Nd : YVO$_4$ laser (the second harmonic) is used, the energy density is set to 10 MW/cm². The film thickness of the semiconductor film is 66 nm. It is noted that an error within ±10° is a permissive level for an orientation ratio of each plane direction.

When the scan speed is 2 cm/sec, the orientation ratio of each plane direction is {100}=8.1%, {110}=4.9%, and {111}=2.0%. When the scan speed is 3 cm/sec, the orientation ratio of each plane direction is {100}=7.9%, {110}=4.2%, and {111}=1.9%. When the scan speed is 20 cm/sec, the orientation ratio of each plane direction is {100}=9.2%, {110}=8.8%, and {111}=1.7%. When the scan speed is 50 cm/sec, the orientation ratio of each plane direction is {100}=3.4%, {110}=9.1%, and {111}=2.0%. When the scan speed is 90 cm/sec, the orientation ratio of each plane direction is {100}=1.5%, {110}=15.7%, and {111}=1.1%

FIG. 3 shows the orientation ratio of each of plane directions {100}, {110}, and {111} with respect to the scan speed. As shown in FIG. 3, the orientation ratio of {100} is high when the scan speed of laser light is less than 20 cm/sec, and the orientation ratio of {110} is high when the scan speed of laser light is over 20 cm/sec.

It is understood from the results shown in FIGS. 2 and 3 that, in the case of the same energy density, the orientation ratio of {100} gets higher when the scan speed of laser light is slow and that the orientation ratio of {110} gets higher when the scan speed of laser light is fast. Accordingly, it is possible to control the orientation ratios of {100} and {110} by the scan speed of laser light which is used for crystallization.

Specifically, it is preferable that laser light is scanned with the scan speed less than 20 cm/sec to get a higher orientation ratio of {100} in a region in which an n-channel TFT is formed and laser light is scanned with the scan speed over 20 cm/sec to get a higher orientation ratio of {110} in a region in which an p-channel TFT is formed. As a result, it is possible to make not only the mobility but also on current get higher.

In FIG. 16, the scan speed in FIG. 3 is converted into energy (W·s/cm²) given to unit area per unit time. Further, Table 1 shows the orientation ratio of each of plane directions {100}, {110}, and {111}, the scan speed, actual values of energy given to unit area per unit time.

[Table 1]

It is understood from FIG. 16 and Table 1 that the orientation ration of {100} gets higher as the energy given to unit area per unit time is higher than 4.7×10⁻⁹ W·s/cm² and conversely, the orientation ration of {110} gets higher as the energy given to unit area per unit time is lower than 4.7×10⁻⁹ W·s/cm².

More specifically, it can be said that the orientation ratio of {100} gets higher when the energy given to unit area per unit time is over than 4.7×10⁻⁹ W·s/cm² and less than 3.1×10⁻⁸ W·s/cm². Further, it can also be said that the orientation ratio of {110} gets higher when the energy given to unit area per unit time is more than 2.2×10⁻⁹ W·s/cm² and under 4.7×10⁻⁹ W·s/cm².

It is noted that it is possible to control the orientation ratios of {100} and {110} more effectively when, in addition to controlling the scan speed of laser light, it is selected if thermal crystallization with a catalytic element is performed or not.

In each of FIGS. 4A and 4B, a mapping figure of an inverse pole figure of a plane direction in a crystal plane in a horizontal direction to a substrate is shown. Before irradiating laser light, a catalytic element is added to a semiconductor film and heat treatment is performed in FIG. 4A. In FIG. 4B, heat treatment is performed to a semiconductor film without adding a catalytic element.

In FIGS. 4A and 4B, samples to which laser light is scanned in a horizontal direction to a substrate are used. In irradiating laser light, continuous emission Nd:YVO$_4$ laser is used, the energy density is set to 10 MW/cm², and the scan speed is 50 cm/sec. The film thickness of the semiconductor film is 66 nm. It is noted that an error within ±10° is a permissive level for an orientation ratio of each plane direction.

With respect to the sample in FIG. 4A, before irradiating laser light, ethanol solution including 10 ppm of Ni as a catalytic element is partially applied and heat treatment is performed at 500° C. for 1 hour and then at 570° C. for 14 hours. According to the above process, a crystal grows from the portion to which ethanol solution including Ni is applied in the horizontal direction to the substrate. On the other hand, with respect to the sample in FIG. 4B, heat treatment is performed at 500° C. for 1 hour and then at 570° C. for 14 hours before irradiating laser light. The application of ethanol solution including Ni is not carried out to the sample in FIG. 4B differently form that in FIG. 4A. Therefore, it is considered that the sample in FIG. 4B is a more amorphous semiconductor film.

The sample in FIG. 4A has the following orientation ratio with respect to each of the plane directions; {100}=3.8%, {110}=15.5%, {111}=1.9%, and the sample in FIG. 4B has the following orientation ratio with respect to each of the plane directions; {100}=3.7%, {110}=9.1%, {111}=1.0%. As a result, it is understood that the sample in FIG. 4A has a higher orientation ratio of {110}.

It will be described with FIG. 5 how to control the orientation ratios of {100} and {110} with controlling the scan speed of laser light and selecting if thermal crystallization with a catalytic element is performed or not.

First, a catalytic element that promotes crystallization of semiconductor film is partially added to an amorphous semiconductor film. Then, when heat treatment is performed, a crystal laterally grows horizontally to the substrate from a region 101 to which the catalytic element is added, as shown by an arrow of a solid line. As a result, there are formed a region 102 crystallized by the catalyst and a region (non-crystallized region) 103 which is not crystallized.

Next, continuous emission laser light is irradiated to each of the region 102 crystallized by the catalyst and the non-crystallized region 103 at different scan speed. Specifically, laser light is irradiated to the region 102 crystallized by the catalyst at scan speed over 20 cm/sec and to the non-crystallized region 103 at scan speed less than 20 cm/sec.

It is noted that the growth direction of the crystal in the region 102 crystallized by the catalyst and the scan direction of laser light may be both horizontal to the substrate and there is no particular correlation between the angle made by the growth direction and the scan direction and the orientation ration of the crystal.

It is noted that a portion of a region to which laser light is irradiated at scan speed over 20 cm/sec in the region 102 crystallized by the catalyst is a region 1 and a portion of a region to which laser light is irradiated at scan speed less than 20 cm/sec in the non-crystallized region 103 is a region 2. The region 1 has a higher orientation ratio of {110} than the region 2 and the region 2 has a higher orientation ratio of {100} than the region 1.

Specifically, it is considered that it is possible to make the orientation ratio of {110} about more than 9% in the region 1 and the orientation ration of {100} about more than 7% in the region 2.

In short, when a p-channel TFT is formed of the semiconductor film of the region 1 and an n-channel TFT is formed of the semiconductor film of the region 2, it is possible to improve not only mobility but also on current of the respective p-channel and n-channel TFFs without disturbing a high integration level.

It is noted that a shape of a region (beam spot) to which laser light is irradiated may be linear or oval, and that a plurality of regions to which laser light is irradiated may be overlapped to use.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the accompanying drawings:

FIGS. 4A and 4B are inverse pole figures in the case of irradiating laser light to a semiconductor film with lateral growth and an amorphous semiconductor film;

FIGS. 9A and 9B are inverse pole figures in the case of irradiating laser light to a semiconductor film with vertical growth and an amorphous semiconductor film;

FIGS. 10A to 10E are diagrams showing a method of manufacturing a semiconductor device of the present invention;

DETAILED DESCRIPTION OF THE PREFERRED EMBODIMENTS

Embodiments of the present invention will be explained below.

[Embodiment Mode 1]

In the present embodiment mode, there will be described a method of manufacturing a TFT, which combines, in addition to controlling the scan speed of laser light, controlling if thermal crystallization with a catalytic element is performed or not.

Figure 1A:
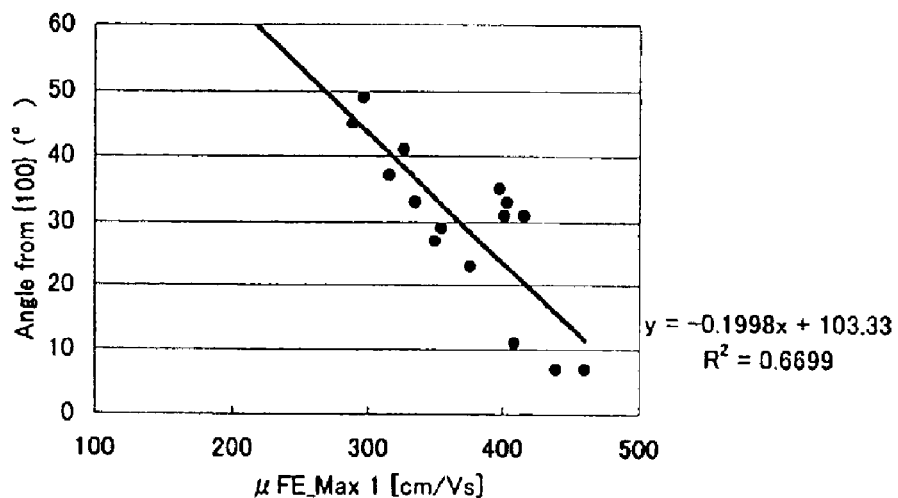
FIGS. 1A and 1B are graphs showing measured data showing the relation between an angle from {100} and mobility of a TFT.
Figure 1B:
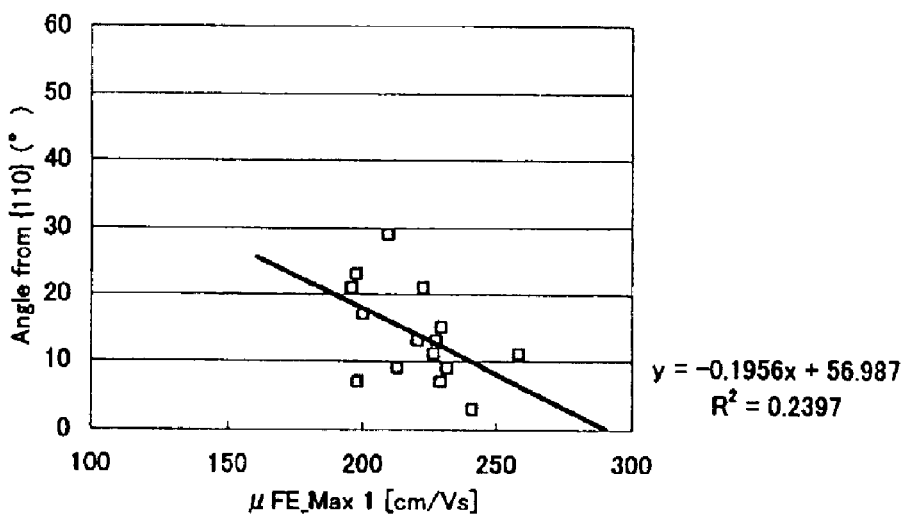
Figure 2:
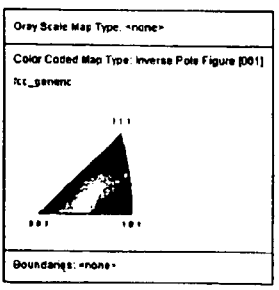
FIG. 2 is an inverse pole figure for each scan speed.
Figure 3:
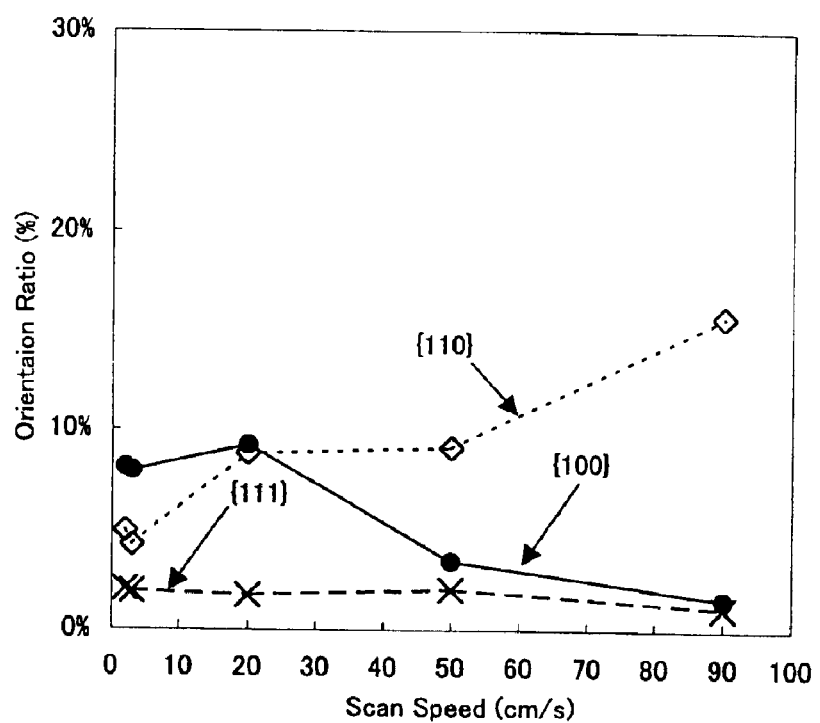
FIG. 3 is a figure showing the relation between a scan speed and an orientation ratio.
Figure 5:
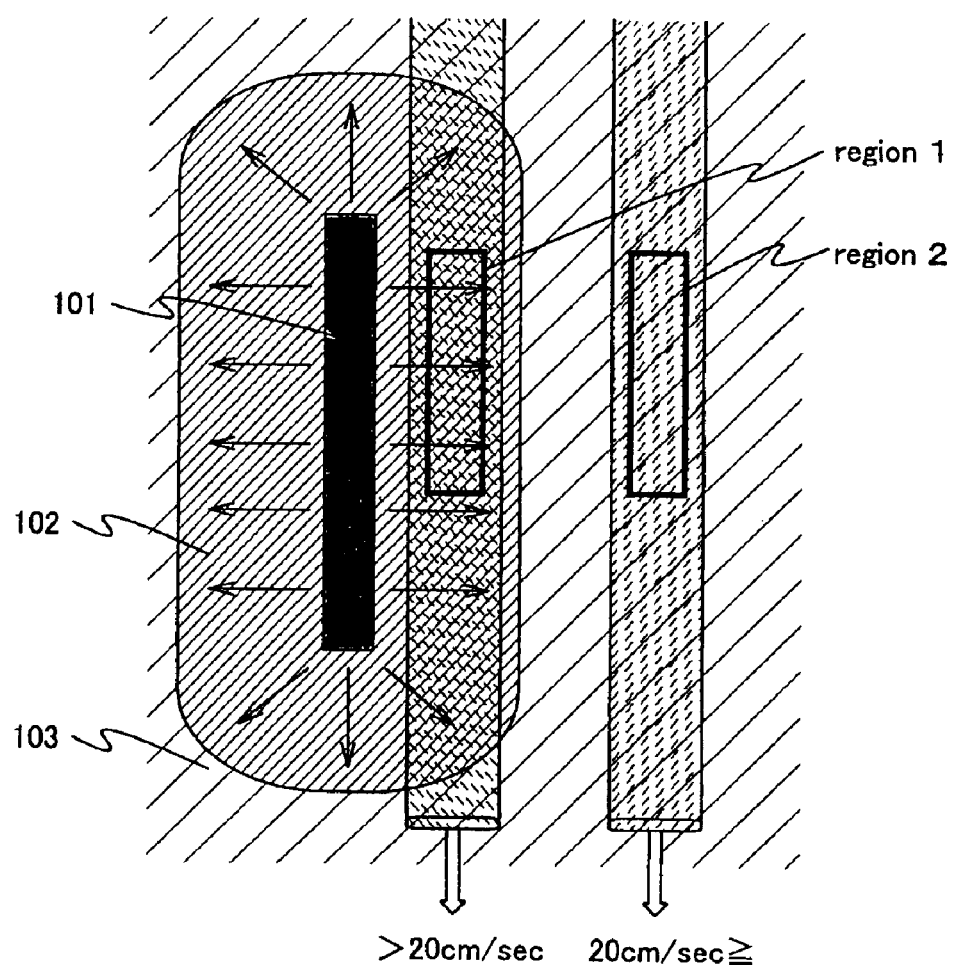
FIG. 5 is a conceptual figure showing how to control an orientation ratio of a crystal with controlling the scan speed of laser light and selecting if thermal crystallization with a catalytic element is performed or not.
Figure 6A:
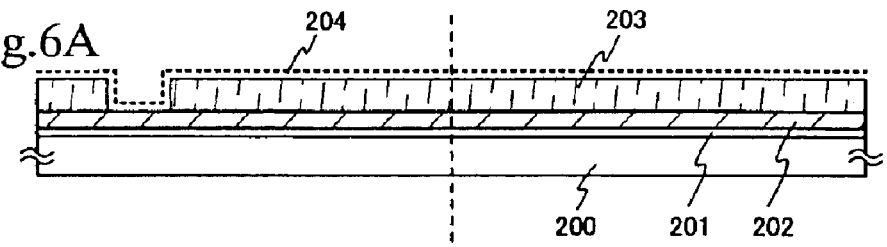
FIGS. 6A to 6E are diagrams showing a method of manufacturing a semiconductor device of the present invention.

First, a base film 201 is formed by deposition on a substrate 200 as shown in FIG. 6A. As the substrate 200, a non-alkali glass substrate, represented by, for example, #1737 glass substrate produced by Corning corp. is used. In addition to the #1737 glass substrate, the barium borosilicate glass such as #7059 glass may be used as the substrate, and a quartz substrate, a silicon substrate, a metallic substrate, or a stainless steel substrate, which has an insulating film formed on the surface, may also be used. Also, a plastic substrate that has a heat resistance to a processing temperature in the present embodiment mode may be used.

The base film is formed of an insulating film such as a silicon oxide film, a silicon nitride film, or a silicon oxynitride film. In the present embodiment mode, a silicon oxynitride film formed of $SiH_4$, $NH_3$, and $N_2O$ is formed to have a thickness of 10 to 200 nm (preferably, 50 to 100 nm) by plasma CVD, and a hydrogenated silicon oxynitride film formed of $SiH_4$ and $N_2O$ is similarly laminated to have a thickness of 50 to 200 nm (preferably, 100 to 150 nm). In FIG. 6A, two layered insulating films are indicated as one-layer base film 201. The base film is not limited to the two-layer structure, and may be a single layer of the above-mentioned insulating film or a three or more laminated structure.

Next, an amorphous semiconductor film 202 with a thickness of 50 nm is formed by plasma CVD on the base film 201. Although it depends on a content of hydrogen, it is preferable that the amorphous semiconductor film 202 is heated at 400 to 550° C. for several hours to perform dehydrogenation and the content of hydrogen is made to be less than 5 atom % for performing a crystallization process. Further, although the amorphous semiconductor film may be formed with a manufacturing method such as sputtering or evaporation, it is preferable to sufficiently reduce impurity elements such as oxygen and nitrogen contained in the film.

It is noted that silicon germanium, for example, may be used as the semiconductor film in addition to silicon. In the case of using silicon germanium, it is preferable that the concentration of germanium is about 0.01 to 4.5 atomic %.

Here, since the base film 201 and the amorphous semiconductor film 202 are both formed by plasma CVD, the base film 201 and the amorphous semiconductor film 202 may be formed continuously in vacuum. Without exposing to the atmosphere after forming the base film 201, it becomes possible to prevent contamination on a surface and to reduce characteristic dispersion between TFTs to be formed.

Next, a mask 203 is successively formed on the amorphous semiconductor film. Then, patterning is performed to the mask 203 to provide an opening portion selectively, and nickel acetate solution containing 1 to 100 ppm by weight of nickel is applied with a spinner. A nickel-containing layer 204 thus formed is in contact with the amorphous semiconductor film 202 in the opening portion of the mask 203 (FIG. 6A).

In order to improve hydrophilic to the nickel acetate solution, it may be carried out that a surface of the amorphous semiconductor film 202 is processed with ozone containing aqueous solution to form a quite thin oxide film, then the oxide film is etched with mixed solution of sulfuric acid and aqueous hydrogen peroxide to form a clean surface, and ozone containing aqueous solution is again used to form another quite thin oxide film. Since a surface of a semiconductor film is originally hydrophobic, the formation of the oxide film it possible to apply nickel acetate solution uniformly.

Of course, how to add the catalyst to the amorphous semiconductor film is not limited to the above method, sputtering, evaporation, or plasma processing may also be employed as another means for forming the nickel containing layer.

Next, heat treatment is performed at 500 to 650° C. for 4 to 24 hours, for example, at 570° C. for 14 hours. As shown by an arrow of a solid line, crystallization of the amorphous semiconductor film proceeds from a portion 205 contacting with the nickel containing layer 204, and a region 206 crystallized with a catalytic element and a region (non-crystallized region) 207 which is not crystallized are formed (FIG. 6B).

Figure 6B:
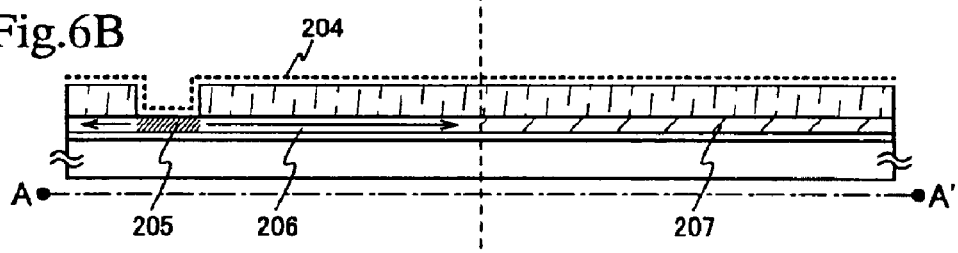
Figure 8A:
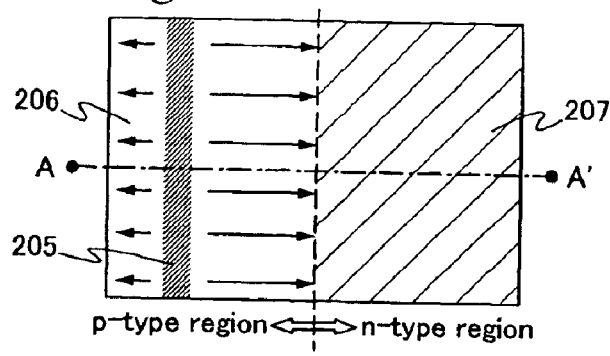
FIGS. 8A to 8D diagrams showing the method of manufacturing the semiconductor device of the present invention.

It is noted that a top view of a sample in the process of heat treatment shown in FIG. 6B is shown in FIG. 8A. FIG. 6B is corresponding to a section along A–A' of FIG. 8A. In FIG. 8A, the mask 203 and the nickel-containing layer 204 are omitted for simplification.

As means of the heat treatment, furnace annealing with an electric furnace or RTA is employed. Although a halogen lamp, a metal halide lamp, a xenon arc lamp, a carbon arc lamp, a high-pressure sodium lamp, or a high-pressure mercury lamp is used in RTA, gas-heating type RTA, which uses heated inert gas, may be applied.

In the case of RTA, a light source of a lump for heating is turned on for 1 to 60 seconds, preferably 30 and 60 seconds, and this operation is repeated once to 10 times, preferably, 2 to 6 times. Although light intensity of the light source of the lamp is optional, it is necessary that the semiconductor film is made to be heated instantaneously to a temperature of 600 to 1000° C. preferably, 650 to 750° C. Even if the temperature is quite high, what happens is only that the semiconductor film is instantaneously heated, and the substrate 200 itself is not deformed.

In the case of using the furnace annealing, heat treatment at 500° C. for 1 hour is performed to discharge hydrogen contained in the amorphous semiconductor film 202 before the heat treatment for crystallization. Then, heat treatment is performed with a electric furnace in a nitrogen atmosphere at 550 to 600° C., preferably at 580° C., for 4 hours to crystallize the amorphous semiconductor film 202.

Although nickel (Ni) is used as the catalytic element in the present embodiment mode, in addition, an element such as germanium (Ge), iron (Fe), palladium (Pa), tin (Sn), lead (Pb), cobalt (Co), platinum (Pt), copper (Cu), or gold (Au) may be used.

After the mask 203 is removed next, laser light is irradiated for crystallization with a suitable scan speed to each of the region 206 crystallized with a catalytic element and the non-crystallized region 207. It is determined suitably which region of the region 206 crystallized with a catalytic element and the non-crystallized region 207 is first irradiated. Here, after irradiation of laser light is performed to crystallize the non-crystallized region 207 to become a region (n-type region) in which an n-channel TFT is formed, irradiation of laser light is performed to crystallize the region 206 crystallized with a catalytic element to become a region (p-type region) in which an p-channel TFT is formed.

Figure 6C:
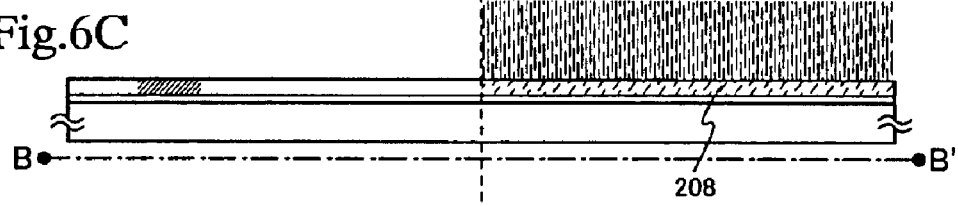

First, as shown in FIG. 6C, laser light is irradiated to the non-crystallized region 207 for highly crystallizing. The non-crystallized region 207 highly crystallized by the irradiation of laser light is called a first crystalline semiconductor film 208 for convenience sake. With respect to laser light irradiated to the non-crystallized region 207, the scan speed is set to more than 1 cm/sec and less than 20 cm/sec. It is necessary that the energy density of the laser light be about 0.01 to 100 $MW/cm^2$ (preferably, 0.1 to 10 $MW/cm^2$).

The first crystalline semiconductor film 208 formed with the above irradiation of laser light has a higher orientation ratio of {100}.

Figure 8B:
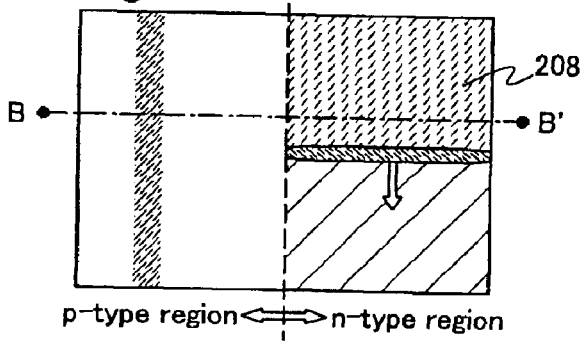

It is noted that a top view of a sample shown in FIG. 6C in the process of irradiating laser light to the non-crystallized region 207, is shown in FIG. 8B. FIG. 6C is corresponding to a section along B–B' of FIG. 8B.

Figure 6D:
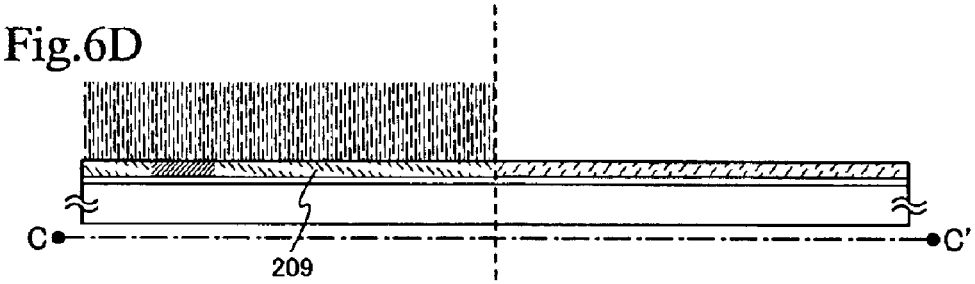

Next, as shown in FIG. 6D, laser light is irradiated to the region 206 crystallized with a catalytic element for highly crystallizing. The region 206 crystallized with a catalytic element and highly crystallized by the irradiation of laser light is called a second crystalline semiconductor film 209 for convenience sake. With respect to laser light irradiated to the region 206 crystallized with a catalytic element, the scan speed is set to over 20 cm/sec and less than 2000 cm/sec. It is necessary that the energy density of the laser light be about 0.01 to 100 $MW/cm^2$ (preferably, 0.1 to 10 $MW/cm^2$).

The second crystalline semiconductor film 209 formed with the above irradiation of laser light has a higher orientation ratio of {110}.

Figure 8C:
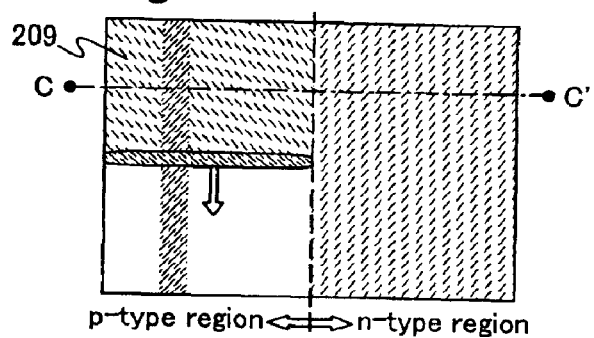

It is noted that a top view of a sample shown in FIG. 6D in the process of irradiating laser light to the region 206 crystallized with a catalytic element, is shown in FIG. 8C. FIG. 6D is corresponding to a section along C–C' of FIG. 8C.

As laser used for twice irradiating laser light above, continuous emission gas laser or solid laser. There are given excimer laser, Ar laser, and Kr laser as the gas laser, and YAG laser, $YVO_4$ laser, YLF laser, $YAlO_3$ laser, glass laser, ruby laser, alexandrite laser, Ti: sapphire laser, and $Y_2O_3$ laser as the solid laser. It is possible to use, as the solid laser, laser with a crystal such as YAG, $YVO_4$, YLF, or $YAlO_3$ which is subjected to doping of Cr, Nd, Er, Ho, Ce, Co, Ti, Yb, or Tm. The fundamental harmonic of the laser depends on a material of doping to have a different fundamental harmonic, and laser light that has about 1 $\mu$m of fundamental harmonic is obtained. With a non-linear optical element, it is possible to obtain a harmonic to the fundamental harmonic.

Further, after converting infrared laser light emitted from solid laser to green laser light with a non-linear optical element, ultraviolet laser light to which the green laser light is converted with another non-linear optical element may be used.

It is possible to obtain a crystal with a large grain size particularly when second to fourth harmonics of a fundamental harmonic are used with solid laser that is capable of continuous emission. Typically, it is preferable to use second harmonic (532 nm) and third harmonic (355 nm) of Nd:$YVO_4$ laser (fundamental harmonic: 1064 nm). Specifically, laser light emitted from continuous emission $YVO_4$ laser (output: 10 W) is converted to the harmonic with a non-linear optical element. Further, there is a method of putting a $YVO_4$ crystal and a non-linear optical element in an oscillator to emit a harmonic.

There will be next described gettering of the catalytic element existing within the second crystalline semiconductor film 209. It is considered that the catalytic element (nickel here) remains with a concentration over $1\times10^{19}$ atoms/cm$^3$ on average in the second crystalline semiconductor film 209 after the crystallization with the catalytic element shown in FIG. 6B. There is a possibility of having a bad influence upon characteristics of a TFT if the catalytic element remains, and therefore it is necessary to provide a process for reducing the concentration of the catalytic element.

Figure 6E:
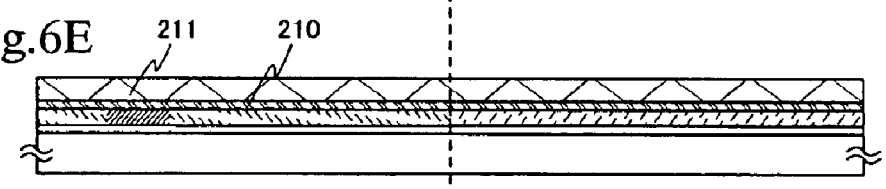

First, a barrier layer 210 is formed on a surface of the first crystalline semiconductor film 208 and the second crystalline semiconductor film 209 as shown in FIG. 6E. The barrier layer 210 is a layer provided in order not to etch the first crystalline semiconductor film 208 and the second crystalline semiconductor film 209 in later removing a gettering site.

A thickness of the barrier layer 210 is set to about 1 to 10 nm, and chemical oxide formed by processing with ozone water may be used as the barrier layer. Further, the chemical oxide can also be formed similarly by processing with an aqueous solution in which an acid such as sulfuric acid, hydrochloric acid, or nitric acid is mixed with aqueous hydrogen peroxide. As another method, plasma treatment may be performed in an oxidizing atmosphere, and it may also be employed that ozone is generated by irradiating ultraviolet light in an oxygen-containing atmosphere to perform oxidizing treatment. In addition, a clean oven may also be used for heating at a temperature on the order of 200 to 350° C. to form a thin oxide film as the barrier layer. Furthermore, an oxide film with a thickness on the order of 1 to 5 nm may also be deposited as a barrier layer with a method such as plasma CVD, sputtering, or evaporation. Anyway, a film, through which the catalytic element is able to move to the side of the gettering site in the process of gettering and no etchant soaks (which protects the first crystalline semiconductor film 208 and the second crystalline semiconductor film 209 from the etchant) in the process of removing the gettering site, for example, a chemical oxide film formed by processing with ozone water, a silicon oxide film (SiOx), or a porous film may be used.

Next, as a gettering site 211, a semiconductor film for gettering (typically, an amorphous silicon film) containing an inert gas element at a concentration more than $1\times10^{20}$ atoms/cm$^3$ is formed on the barrier layer 210 with sputtering to have a thickness of 25 to 250 nm. It is preferable that a film that has a low density is formed as the gettering site 211 to be later removed in order to have a large selection ratio to the first crystalline semiconductor film 208 and the second crystalline semiconductor film 209.

Figure 7A:
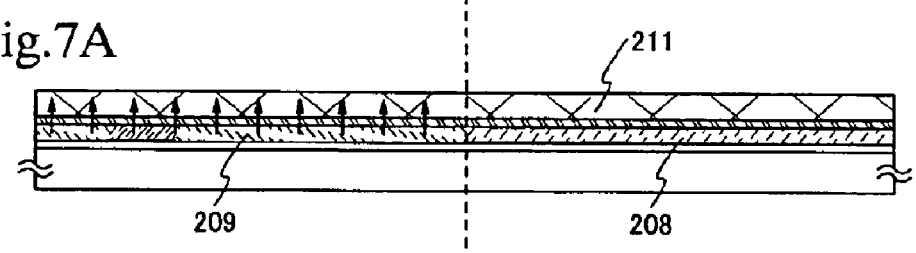
FIGS. 7A to 7D are diagrams showing the method of manufacturing the semiconductor device of the present invention.

It is noted that the inert gas element which itself is inert in a semiconductor film has no bad influence on the first crystalline semiconductor film 208 and the second crystalline semiconductor film 209. As the inert gas element, one element or a plurality of elements selected from the group consisting of helium (He), neon (Ne), argon (Ar), krypton (Kr), and xenon (Xe) are used Next, heat treatment with furnace annealing or RTA is performed to achieve the gettering (FIG. 7A). In the case of furnace annealing, heat treatment is performed in a nitrogen atmosphere at 450 to 600° C. for 0.5 to 12 hours. In the case of RTA, a light source of a lump for heating is turned on for 1 to 60 seconds, preferably 30 and 60 seconds, and this operation is repeated once to 10 times, preferably, 2 to 6 times. Although light intensity of the light source of the lamp is optional, it is necessary that the semiconductor film is made to be heated instantaneously to a temperature of 600 to 1000° C. preferably, 700 to 750° C.

According to the above heat treatment, the catalytic element in the second crystalline semiconductor film 209 is released by thermal energy and moved to the gettering site 211 by diffusion as shown by an arrow. Accordingly, the gettering depends on a treatment temperature, and proceeds for a shorter time as the treatment temperature is higher.

Figure 7B:
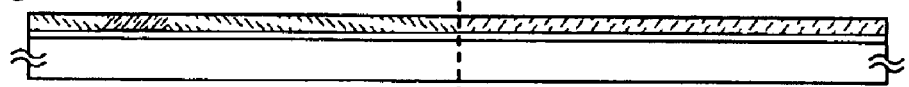

After completing the process of the gettering, the gettering site 211 is selectively etched to remove. As a means of etching, there is given dry etching which does not utilize $ClF_3$ plasma, or wet etching with an alkaline solution such as hydrazine or an aqueous solution containing tetraethyl-ammonium-hydroxide (chemical formula: $(CH_3)_4NOH$)). At this time, the barrier layer 210 functions as an etching stopper. After that, the barrier layer 210 is removed with hydrofluoric acid (FIG. 7B).

Figure 7C:
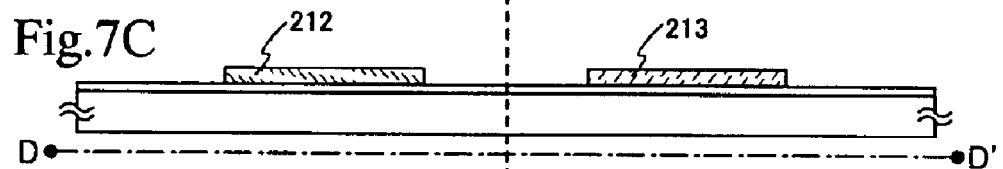

Then, after removing the barrier layer 210, patterning is performed to the first crystalline semiconductor film 208 and the second crystalline semiconductor film 209 to form island-shaped semiconductor films 212 and 213 (FIG. 7C). The island-shaped semiconductor film 213 formed from the first crystalline semiconductor film 208 has a higher orientation ratio of {100}, and the island-shaped semiconductor film 212 formed from the second crystalline semiconductor film 209 has a higher orientation ratio of {110}.

Figure 8D:
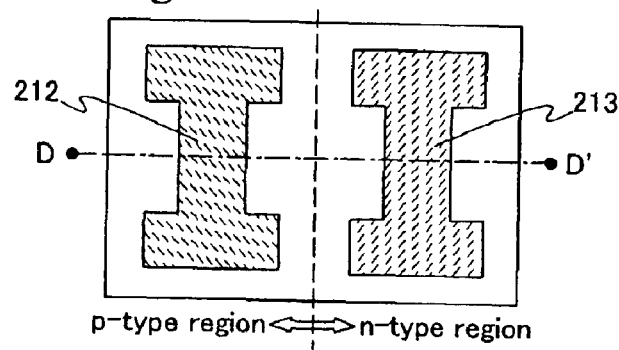

It is noted that a top view of a sample shown in FIG. 7C after forming the island-shaped semiconductor films 212 and 213 is shown in FIG. 8D. FIG. 7C is corresponding to a section along D–D' of FIG. 8D.

Figure 7D:
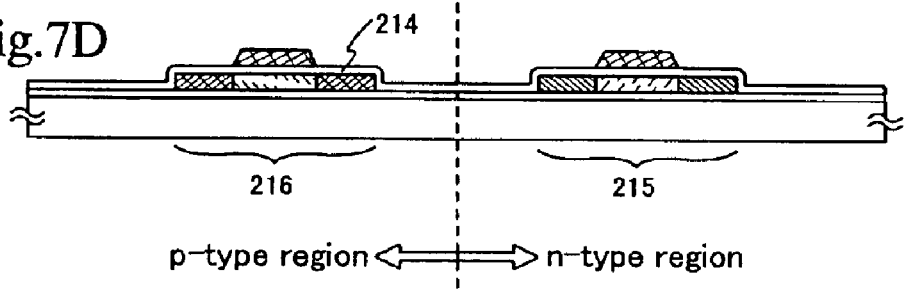

Then, as shown in FIG. 7D, an n-channel TFT 215 and a p-channel TFT 216 are formed through forming a gate insulating film 214, adding an impurity to the island-shaped semiconductor films 212 and 213 to form source and drain regions, and forming a gate electrode. It is noted that the n-channel TFT 215 and the p-channel TFT 216 are not limited to the structure shown in FIG. 7A.

According to the above series of manufacturing processes, it is possible to improve not only mobility but also on current of each of a p-channel TFT and an n-channel TFT without disturbing a high integration level.

[Embodiment Mode 2]

In the present embodiment mode, there will be described the case of irradiating laser light for crystallization after crystallization with a catalytic element in a perpendicular direction to a substrate (vertical growth) in a p-type region.

In each of FIGS. 9A and 9B, a mapping figure of an inverse pole figure of a plane direction in a crystal plane in a horizontal direction to a substrate is shown. Before irradiating laser light, a catalytic element is added to a semiconductor film and heat treatment is performed in FIG. 9A. In FIG. 9B, heat treatment is performed to a semiconductor film without adding a catalytic element.

In FIGS. 9A and 9B, samples to which laser light is scanned in a horizontal direction to a substrate are used. In irradiating laser light, continuous emission Nd:YVO$_4$ laser is used, the energy density is set to 10 MW/cm$^2$, and the scan speed is 50 cm/sec. The film thickness of the semiconductor film is 150 nm. It is noted that an error within ±10° is a permissive level for an orientation ratio of each plane direction.

With respect to the sample in FIG. 9A, before irradiating laser light, aqueous solution including 10 ppm of Ni as a catalytic element is entirely applied and heat treatment is performed at 500° C. for 1 hour and then at 550° C. for 4 hours. According to the above process, a crystal grows from a surface of the semiconductor film in the perpendicular direction to the substrate. On the other hand, with respect to the sample in FIG. 9B, only heat treatment is performed at 500° C. for 1 hour before irradiating laser light. The application of ethanol solution including Ni is not carried out to the sample in FIG. 9B differently form that in FIG. 9A. Therefore, it is considered that the sample in FIG. 9B is a more amorphous semiconductor film.

The sample in FIG. 9A has the following orientation ratio with respect to each of the plane directions; {100}=1.8%, {110}=14.1%, {111}=1.3%, while the sample in FIG. 9B has the following orientation ratio with respect to each of the plane directions; {100}=5.1%, {110}=9.4%, {111}=3.0%. As a result, it is understood that the sample in FIG. 9A has a higher orientation ratio of {110}.

There will be described next a manufacturing method of a TFT that uses the above-mentioned vertical growth of the crystallization process in addition to controlling a scan speed of laser light.

First, a base film 301 is formed by deposition on a substrate 300 similarly to Embodiment Mode 1 (FIG. 10A).

It is possible to use any kind of substrates shown in Embodiment Mode 1 as the substrate 300. With respect to the base film 301, a single layer or a two or more laminated structure of insulting films shown in Embodiment Mode 1 is used. In the present embodiment mode, a silicon oxynitride film formed of SiH$_4$, NH$_3$, and N$_2$O is formed to have a thickness of 10 to 200 nm (preferably, 50 to 100 nm) by plasma CVD, and a hydrogenated oxynitride film formed of SiH$_4$ and N$_2$O is similarly laminated to have a thickness of 50 to 200 nm (preferably, 100 to 150 nm).

Next, an amorphous semiconductor film 302 with a thickness of 50 nm is formed by plasma CVD on the base film 301. It is suitable to refer to Embodiment Mode 1 with respect to conditions of deposition and a material for the amorphous semiconductor film 302.

The amorphous semiconductor film 302 is divided into a region (p-type region) 302 in which a p-channel TFT is formed and a region (n-type region) 303 in which an n-channel TFT is formed next. When the p-type region and the n-type region are separate, it is possible in later crystallization with a catalytic element to prevent a crystal from growing laterally from a region to which the catalytic element is added. Accordingly, it is possible to design an interval between the p-channel TFT and n-channel TFT without considering a distance of lateral growth of the crystal.

Then, resist is formed by deposition and patterning is performed to form a mask 304 only on the n-type region 303. After that, nickel acetate solution containing 1 to 100 ppm by weight of nickel is applied by a spinner. A nickel-containing layer 305 thus formed is in contact with the p-type region 302 that is exposed without being covered by the mask 304 (FIG. 10B).

In order to improve hydrophilic to the nickel acetate solution, it may be carried out that a surface of the p-type region 302 is processed with ozone containing aqueous solution to form a quite thin oxide film, then the oxide film is etched with mixed solution of sulfuric acid and aqueous hydrogen peroxide to form a clean surface, and ozone containing aqueous solution is again used to form another quite thin oxide film. Since a surface of a semiconductor film is originally hydrophobic, the formation of the oxide film it possible to apply nickel acetate solution uniformly.

Of course, how to add the catalyst to the p-type region 302 is not limited to the above method, sputtering, evaporation, or plasma processing may also be employed as another means for forming the nickel containing layer.

Next, heat treatment is performed at 500 to 650° C. for 4 to 24 hours, for example, at 570° C. for 14 hours. With the heat treatment, crystallization proceeds vertically from a surface of the p-type region 302 toward the substrate 300 in the p-type region 302 that is in contact with the nickel containing layer 305, and a region 306 crystallized with a catalytic element and a region (non-crystallized region) 307 which is not crystallized are formed (FIG. 10C).

It is possible to refer to Embodiment Mode 1 (FIG. 6B) with respect to how to perform the heat treatment and select the catalytic element.

After the mask 304 is removed next, laser light is irradiated for crystallization with a suitable scan speed to each of the region 306 crystallized with a catalytic element and the non-crystallized region 307. It is determined suitably which region of the region 306 crystallized with a catalytic element and the non-crystallized region 307 is first irradiated. Here, after irradiation of laser light is performed to crystallize the non-crystallized region 307 to become a region (n-type region) in which an n-channel TFT is formed, irradiation of laser light is performed to crystallize the region 306 crystallized with a catalytic element to become a region (p-type region) in which an p-channel TFT is formed.

First, as shown in FIG. 10D, laser light is irradiated to the non-crystallized region 307 for highly crystallizing. The non-crystallized region 307 highly crystallized by the irradiation of laser light is called a first crystalline semiconductor film 308 for convenience sake. With respect to laser light irradiated to the non-crystallized region 307, the scan speed is set to more than 1 cm/sec and less than 20 cm/sec. It is necessary that the energy density of the laser light be about 0.01 to 100 MW/cm$^2$ (preferably, 0.1 to 10 MW/cm$^2$).

The first crystalline semiconductor film 308 formed with the above irradiation of laser light has a higher orientation ratio of {100}.

Next, as shown in FIG. 10E, laser light is irradiated to the region 306 crystallized with a catalytic element for highly crystallizing. The region 306 crystallized with a catalytic element and highly crystallized by the irradiation of laser light is called a second crystalline semiconductor film 309 for convenience sake. With respect to laser light irradiated to the region 306 crystallized with a catalytic element, the scan speed is set to over 20 cm/sec and less than 2000 cm/sec. It is necessary that the energy density of the laser light be about 0.01 to 100 MW/cm$^2$ (preferably, 0.1 to 10 MW/cm$^2$).

The second crystalline semiconductor film 309 formed with the above irradiation of laser light has a higher orientation ratio of {110}.

As laser used for twice irradiating laser light above, continuous emission gas laser or solid laser. There are given excimer laser, Ar laser, and Kr laser as the gas laser, and YAG laser, YVO$_4$ laser, YLF laser, YAlO$_3$ laser, glass laser, ruby laser, alexandrite laser, Ti: sapphire laser, and Y$_2$O$_3$ laser as the solid laser. It is possible to use, as the solid laser, laser with a crystal such as YAG, YVO$_4$, YLF, or YAlO$_3$ which is subjected to doping of Cr, Nd, Er, Ho, Ce, Co, Ti, Yb, or Tm. The fundamental harmonic of the laser depends on a material of doping to have a different fundamental harmonic, and laser light that has about 1 $\mu$m of fundamental harmonic is obtained. With a non-linear optical element, it is possible to obtain a harmonic to the fundamental harmonic.

Further, after converting infrared laser light emitted from solid laser to green laser light with a non-linear optical element, ultraviolet laser light to which the green laser light is converted with another non-linear optical element may be used.

It is possible to obtain a crystal with a large grain size particularly when second to fourth harmonics of a fundamental harmonic are used with solid laser that is capable of continuous emission. Typically, it is preferable to use second harmonic (532 nm) and third harmonic (355 nm) of Nd:YVO$_4$ laser (fundamental harmonic: 1064 nm). Specifically, laser light emitted from continuous emission YVO$^4$ laser (output: 10 W) is converted to the harmonic with a non-linear optical element. Further, there is a method of putting a YVO$_4$ crystal and a non-linear optical element in an oscillator to emit a harmonic.

There will be next described gettering of the catalytic element existing within the second crystalline semiconductor film 309. It is considered that the catalytic element (nickel here) remains with a concentration over 1×10$^{19}$/cm$^3$ on average in the second crystalline semiconductor film 309 after the crystallization with the catalytic element shown in FIG. 10B. There is a possibility of having a bad influence upon characteristics of a TFT if the catalytic element remains, and therefore it is necessary to provide a process for reducing the concentration of the catalytic element.

Figure 11A:
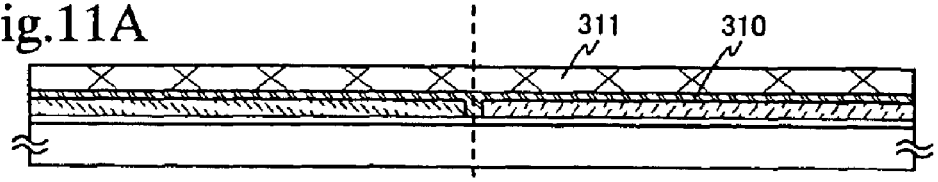
FIGS. 11A to 11E are diagrams showing the method of manufacturing the semiconductor device of the present invention.

First, a barrier layer 310 is formed on a surface of the first crystalline semiconductor film 308 and the second crystalline semiconductor film 309 as shown in FIG. 11A. The barrier layer 310 is a layer provided in order not to etch the first crystalline semiconductor film 308 and the second crystalline semiconductor film 309 in later removing a gettering site.

A thickness of the barrier layer 310 is set to about 1 to 10 nm, and chemical oxide formed by processing with ozone water may be used as the barrier layer. Further, the chemical oxide can also be formed similarly by processing with an aqueous solution in which an acid such as sulfuric acid, hydrochloric acid, or nitric acid is mixed with aqueous hydrogen peroxide. As another method, plasma treatment may be performed in an oxidizing atmosphere, and it may also be employed that ozone is generated by irradiating ultraviolet light in an oxygen-containing atmosphere to perform oxidizing treatment. In addition, a clean oven may also be used for heating at a temperature on the order of 200 to 350° C. to form a thin oxide film as the barrier layer. Furthermore, an oxide film with a thickness on the order of 1 to 5 nm may also be deposited as a barrier layer with a method such as plasma CVD, sputtering, or evaporation. Anyway, a film, through which the catalytic element is able to move to the side of the gettering site in the process of gettering and no etchant soaks (which protects the first crystalline semiconductor film 308 and the second crystalline semiconductor film 309 from the etchant) in the process of removing the gettering site, for example, a chemical oxide film formed by processing with ozone water, a silicon oxide film (SiOx), or a porous film may be used.

Next, as a gettering site 311, a semiconductor film for gettering (typically, an amorphous silicon film) containing an inert gas element at a concentration more than 1×10$^{20}$ atoms/cm$^3$ is formed on the barrier layer 310 with sputtering to have a thickness of 25 to 250 nm. It is preferable that a film that has a low density is formed as the gettering site 311 to be later removed in order to have a large selection ratio to the first crystalline semiconductor film 308 and the second crystalline semiconductor film 309.

Figure 11B:
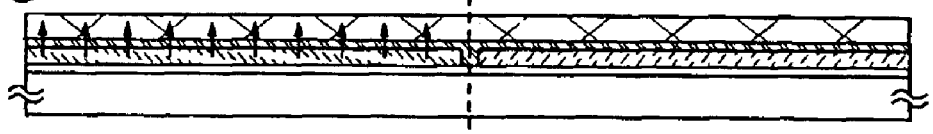

It is noted that the inert gas element which itself is inert in a semiconductor film has no bad influence on the first crystalline semiconductor film 308 and the second crystalline semiconductor film 309. As the inert gas element, one element or a plurality of elements selected from the group consisting of helium (He), neon (Ne), argon (Ar), krypton (Kr), and xenon (Xe) are used Next, heat treatment with furnace annealing or RTA is performed to achieve the gettering (FIG. 11B). In the case of furnace annealing, heat treatment is performed in a nitrogen atmosphere at 450 to 600° C. for 0.5 to 12 hours. In the case of RTA, a light source of a lump for heating is turned on for 1 to 60 seconds, preferably 30 and 60 seconds, and this operation is repeated once to 10 times, preferably, 2 to 6 times. Although light intensity of the light source of the lamp is optional, it is necessary that the semiconductor film is made to be heated instantaneously to a temperature of 600 to 1000° C. preferably, 700 to 750° C.

According to the above heat treatment, the catalytic element in the second crystalline semiconductor film 309 is released by thermal energy and moved to the gettering site 311 by diffusion as shown by an arrow. Accordingly, the gettering depends on a treatment temperature, and proceeds for a shorter time as the treatment temperature is higher.

Figure 11C:
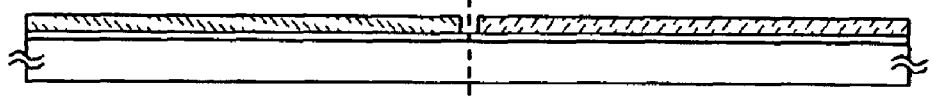

After completing the process of the gettering, the gettering site 311 is selectively etched to remove. As a means of etching, there is given dry etching which does not utilize ClF$_3$ plasma, or wet etching with an alkaline solution such as hydrazine or an aqueous solution containing tetraethyl-ammonium-hydroxide (chemical formula: (CH$_3$)$_4$NOH)). At this time, the barrier layer 310 functions as an etching stopper. After that, the barrier layer 310 is removed with hydrofluoric acid (FIG. 11C).

Figure 11D:

Then, after removing the barrier layer 310, patterning is performed to the first crystalline semiconductor film 308 and the second crystalline semiconductor film 309 to form island-shaped semiconductor films 312 and 313 (FIG. 11D). The island-shaped semiconductor film 313 formed from the first crystalline semiconductor film 308 has a higher orientation ratio of {100}, and the island-shaped semiconductor film 312 formed from the second crystalline semiconductor film 309 has a higher orientation ratio of {110}.

Figure 11E:
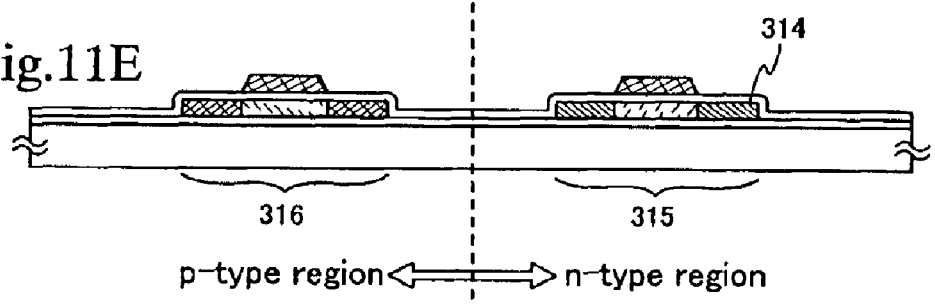

Then, as shown in FIG. 11E, an n-channel TFT 315 and a p-channel TFT 316 are formed through forming a gate insulating film 314, adding an impurity to the island-shaped semiconductor films 312 and 313 to form source and drain regions, and forming a gate electrode. It is noted that the n-channel TFT 315 and the p-channel TFT 316 are not limited to the structure shown in FIG. 11E.

According to the above series of manufacturing processes, it is possible to improve not only mobility but also on current of each of a p-channel TFT and an n-channel TFT without disturbing a high integration level.

It is noted that the gettering process in the present invention is not limited to the method described in Embodiment modes 1 and 2. Other method may be used for reducing the catalytic element in the semiconductor film.

[Embodiment]

Hereafter, embodiments of the present invention will be described.

[Embodiment 1]

In the present embodiment, a semiconductor display device, that is one of semiconductor devices manufactured in accordance with a manufacturing method of the present invention, is given as an example, and a scanning course of laser light in crystallization will be described.

Figure 12A:
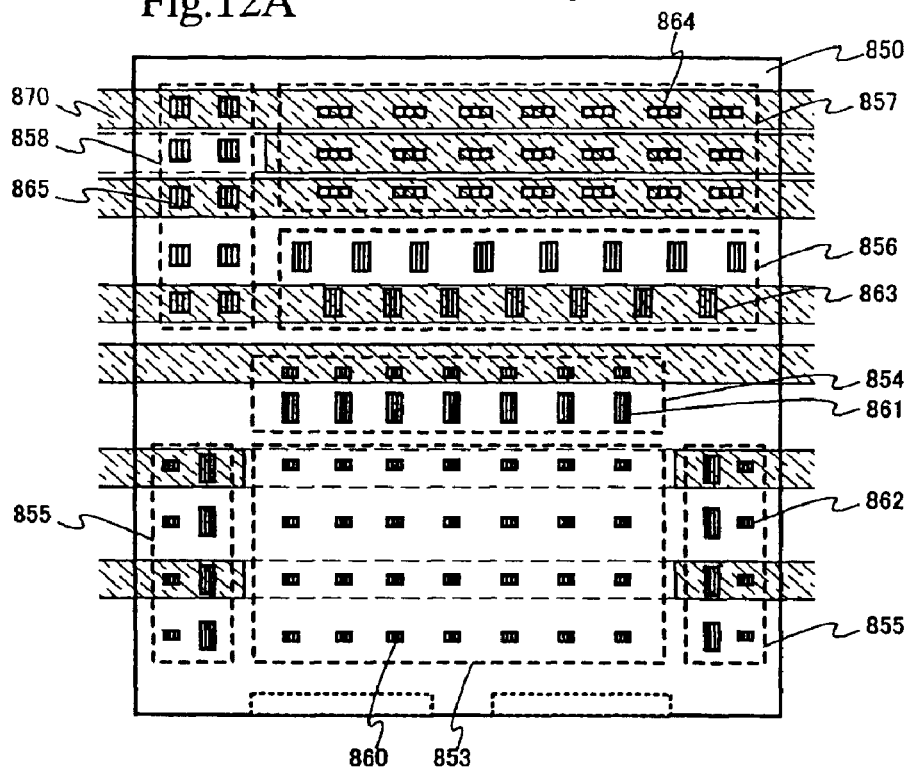
FIGS. 12A and 12B are diagrams showing a scanning course of laser light.
Figure 12B:
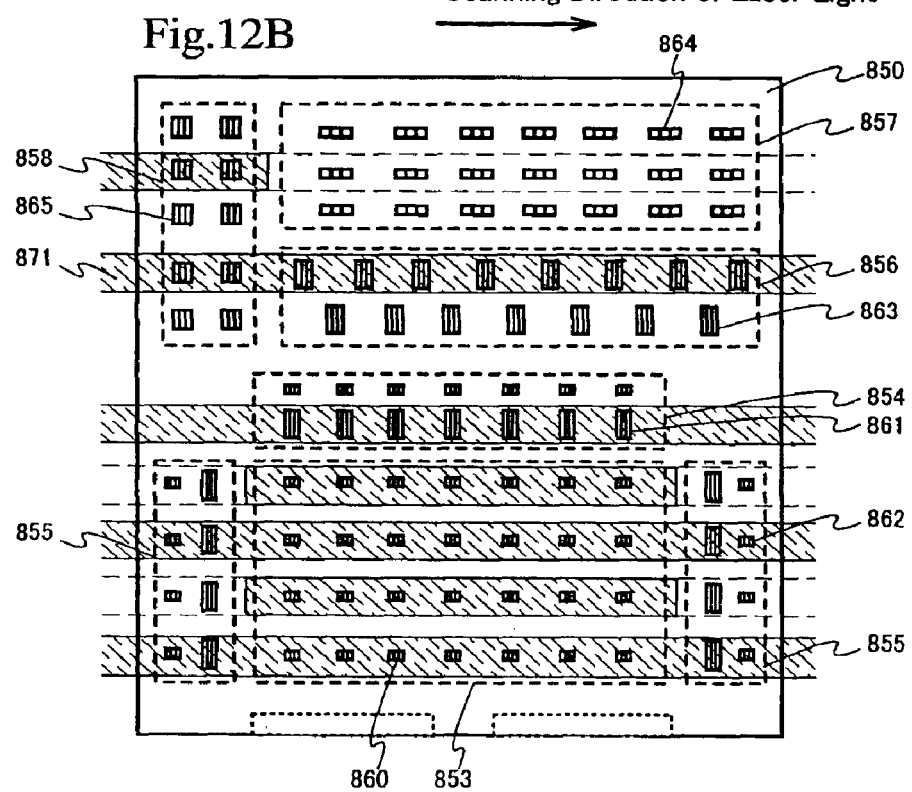

FIG. 12A shows a canning course of laser light in irradiating laser light to an n-type region, and FIG. 12B shows a canning course of laser light in irradiating laser light to a p-type region. It is noted, in FIGS. 12A and 12B, that a semiconductor film 850 is formed on a substrate and broken lines show regions in which a pixel region 853, a source line driving circuit 854, a gate line driving circuit 855, an image signal processing circuit 856, a VRAM (Video Random Access Memory) 857, and a timing signal generating circuit 858 are respectively formed in the semiconductor film 850.

The VRAM 857 has a function of memorizing data that has image information input from the outside. The image signal processing circuit 856 has a function of processing the data to generate an image signal in accordance with the standard of the source line driving circuit 854 and inputting the image signal to the source line driving circuit 854. The timing signal generating circuit 858 has a function of generating signals such as a clock signal (CLK), a start pulse signal (SP), and a latch signal which control timing for driving the source line driving circuit 854, the gate line driving circuit 855, and the image signal processing circuit 856.

All TFTs formed in the pixel portion 853 are of a p-channel type and all TFTs formed in the VRAM 857 are of an n-channel type. In the source line driving circuit 854, the gate line driving circuit 855, the image signal processing circuit 856, and the timing signal generating circuit 858, TFTs include both the n-channel TFT and the p-channel TFT.

Further, FIGS. 12A and 12B show regions 860 to 865 to become active layers of respective TFTs later formed in the pixel portion and the respective circuits. Specifically, a plurality of regions 860 are arranged in the pixel portion 853, a plurality of regions 861 are arranged in the source line driving circuit 854, a plurality of regions 862 are arranged in the gate line driving circuit 855, a plurality of regions 863 are arranged in the image signal processing circuit 856, a plurality of regions 864 are arranged in the VRAM 857, and a plurality of regions 865 are arranged in the timing signal generating circuit 858.

In FIGS. 12A and 12B, the regions 860 to 865 to become active layers, which are actually several tens of $\mu$m large, are shown as larger regions than the actual without considering a measure in order to easily understand the figures.

FIG. 12A shows a region (track) 870 to which laser light is scanned in scanning laser light to the n-type region of the semiconductor layer 850 along the direction of an arrow of a solid line.

The n-type region includes all the regions 864 and some of the regions 861, 862, 863, 865 that are respectively overlapped with the track 870. In the case of overlapping the scanning course of laser light to the n-type region with the p-type region, for example, the region 860, such as a shutter is used in order not to irradiate laser light to the p-type region. For example, an AO modulator that is able to modulate laser light of a proceeding direction at high speed may be provided to use as a shutter in the light path between the substrate to be processed and a laser oscillation device.

FIG. 12B shows a region (track) 871 to which laser light is scanned in scanning laser light to the p-type region of the semiconductor layer 850 along the direction of an arrow of a solid line.

The p-type region includes all the regions 860 and some of the regions 861, 862, 863, 865 that are respectively overlapped with the track 871. Similarly to the case of FIG. 12A, such as a shutter is used in order not to irradiate laser light to the n-type region in the case of overlapping the scanning course of laser light to the p-type region with the n-type region, for example, the region 864.

According to the above-mentioned present embodiment, it is possible to set a scan speed of laser light suitably and control an orientation ratio of a crystal in each of the n-type region and the p-type region on the same substrate.

As described in the present embodiment, it is preferable in terms of improvement of mobility that the regions 860 to 865 to become active layers are arranged in order that a channel length direction of a TFT to be formed later and the scanning direction of laser light coincide.

Further, it is not necessary to arrange the pixel portion and the respective circuits of the semiconductor display device as shown FIGS. 12A and 12B, and a scanning speed of laser light and a part shaded by such as a shutter may be set in accordance with the layout.

[Embodiment 2]

In the present embodiment, there will be described one embodiment of gettering that is different from the method described in the embodiment modes. The present embodiment uses a technique disclosed in Japanese Patent Application Laid-open No. 10-135468 or 10-135469, in which a catalytic element used for crystallizing an amorphous semi-conductor film is removed with a gettering action of phosphorous after the crystallization. According to the technique, it is possible to reduce a concentration of the catalytic element in a crystalline semiconductor film to less than $1\times10^{17}$ atoms/cm$^3$, preferably less than $1\times10^{16}$ atoms/cm$^3$.

Figure 13A:
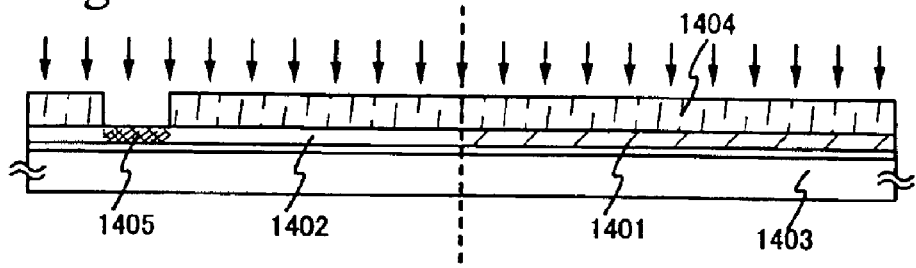
FIGS. 13A to 13C are diagrams showing one embodiment of gettering.

In accordance with Embodiment Mode 1 or Embodiment Mode 2, a first crystalline semiconductor film 1401 crystallized with irradiation of laser light and a second semiconductor film 1402 crystallized with a catalytic element and more with irradiation of laser light are both formed on a substrate 1403 as shown in FIG. 13A. The first crystalline semiconductor film 1401 and the second crystalline semiconductor film 1402 are corresponding to an n-type region and p-type region, respectively.

Then, silicon oxide film 1404 as a mask is formed to have a thickness of 150 nm for covering the first crystalline semiconductor film 1401 and the second crystalline semiconductor film 1402, and patterning is performed to provide an opening portion and expose a part of the second crystalline semiconductor film 1402. After that, phosphorous is added to provide in the second crystalline semiconductor film 1402 a region 1405 to which phosphorous is added.

Figure 13B:
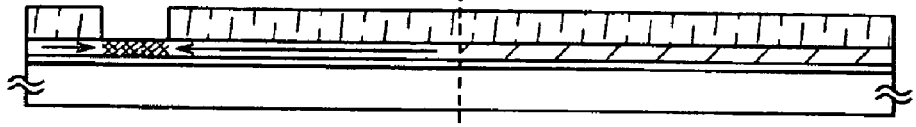
Figure 13C:
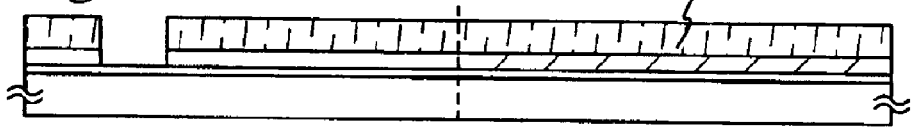

With this state, heat treatment is performed at 550 to 800° C. for 5 to 24 hours, for example, at 600° C. for 12 hours in a nitrogen atmosphere. At this time, the region 1405 to which phosphorous is added functions as a gettering site, and the catalytic element remaining in the second crystalline semiconductor film 1402 is made to segregate in the region 1405 to which phosphorous is added (FIG. 13B).

Thereafter, etching is performed to remove the region 1405 to which phosphorous is added. As a result, a concentration of the catalytic element can be reduced to lass than $1 \times 10^{17}$ atms/cm$^3$ in a remaining portion, which is not subjected to the removal, of the second crystalline semiconductor film 1402.

Next, the silicon oxide film 1404 as a mask is removed, and patterning is performed to the first crystalline semiconductor film 1401 and the remaining portion of the second crystalline semiconductor film 1402 and then, to form island-shaped semiconductor films.

The present embodiment can be carried out with combining Embodiment 1.

[Embodiment 3]

The present embodiment will describe in detail a semiconductor device formed in accordance with a manufacturing method of the present invention. Although a light-emitting device using a light-emitting element is given as an example in the present embodiment, the present invention is not limited to the present embodiment. The present invention may be applied to devices a liquid crystal display device and other semiconductor display devices. In addition, a semiconductor device that is not a semiconductor display device may be given.

Figure 14:
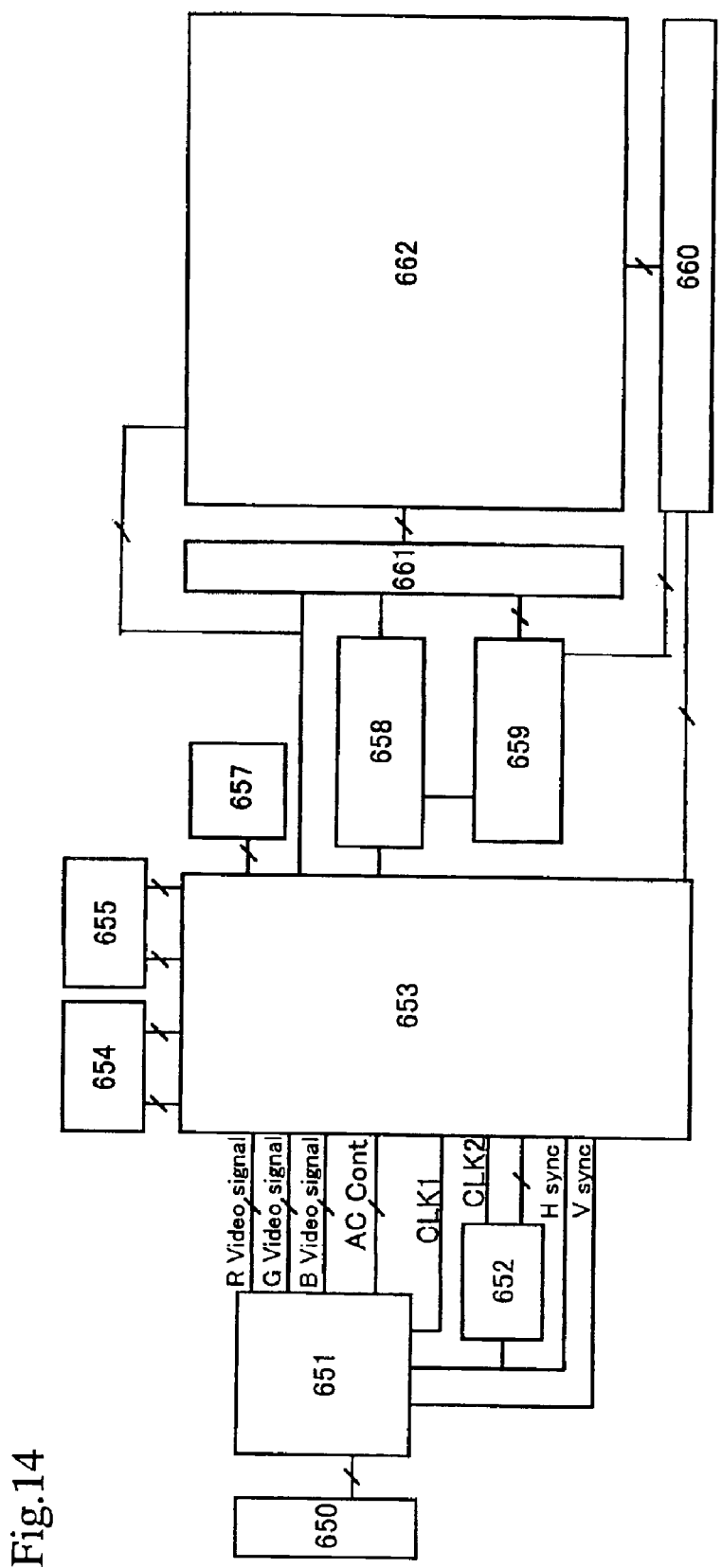
FIG. 14 is a block diagram of a light-emitting device.

Shown in FIG. 14 is a light emitting device of the present embodiment which has an interface (I/F) 650, a panel link receiver 651, a phase locked loop (PLL) 652, a field programmable logic device (FPGA) 653, SDRAM (Synchronous Dynamic Random Access Memory) 654 and 655, ROM (Read Only Memory) 657, a voltage controlling circuit 658, and a power supply 659. Although the SDRAM is used in the present embodiment, DRAM (Dynamic Random Access Memory) or SRAM (Static Random Access Memory) can be used instead of the SDRAM if it is possible to write in and read out data at high speed.

Digital image signals input to the light emitting device through the interface 650 are subjected to parallel-serial conversion in the panel link receiver 651 and input to the field programmable logic device 653 as image signals which are corresponding to respective colors of red, green, and blue.

In addition, based on various kinds of signals input to the light-emitting device through the interface 650, H sync signal, V sync signal, clock signal, and AC cont, are generated in the panel link receiver 651 to be input to the field programmable logic device 653.

The phase locked loop 652 has a function of synchronizing frequencies of the various kinds of signals input to the light emitting device and an operation frequency of the field programmable logic device 653. The operation frequency of the field programmable logic device 653 is not always the same as the frequencies of the various kinds of signals input to the light emitting device, and adjusted in the phase locked loop 652 in order to synchronize each other.

The ROM 657 memorizes a program for controlling an operation of the field programmable logic device 653, and the field programmable logic device 653 operates in accordance with the program.

The image signals input to the field programmable logic device 653 are once written in the SDRAM 654 and 655 and stored. In the field programmable logic device 653, a bit of image signal of the all bits of image signals stored in the SDRAM 654 is read out for each pixel and input to a source line driving circuit 660.

Further, in the field programmable logic device 653, information on a length of a light-emitting period of the light-emitting element, which is corresponding to each bit, is input to a gate line driving circuit 661.

The voltage controlling circuit 658 adjusts a voltage between an anode and a cathode of a light-emitting element in each pixel in accordance with a signal input from the field programmable logic device 653. The power supply 659 supplies a predetermined voltage to the voltage controlling circuit 658, the source line driving circuit 660, and the gate line driving circuit 661.

The present embodiment can be carried out with freely combining any of Embodiments 1 or 2.

[Embodiment 4]

Electronic apparatuses, each using a semiconductor device according to the present invention, include a video camera, a digital camera, a goggles-type display (head mount display), a navigation system, a sound reproduction device (such as a car audio and an audio set), a lap-top computer, a game machine, a portable information terminal (such as a mobile computer, a mobile telephone, a portable game machine, and an electronic book), an image reproduction device including a recording medium (more specifically, an device which can reproduce a recording medium such as a digital versatile disc (DVD) and display the reproduced image), or the like. Specific examples thereof are shown in FIGS. 15A to 15H.

Figure 15A:
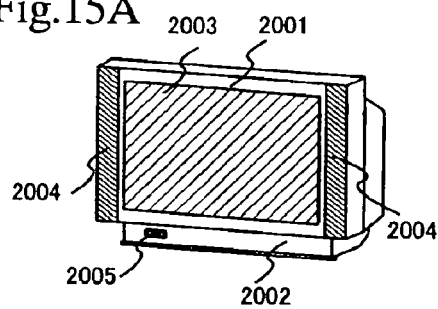
FIGS. 15A to 15H are diagrams showing electronic apparatuses.

FIG. 15A illustrates a display device which includes a casing 2001, a support table 2002, a display portion 2003, a speaker portion 2004, a video input terminal 2005 and the like. It makes the display device complete to apply the semiconductor device to the display portion 2003 or a circuit such as a signal processing circuit. The display device includes all display devices for displaying information, such as a personal computer, a receiver of TV broadcasting and an advertising display.

Figure 15B:
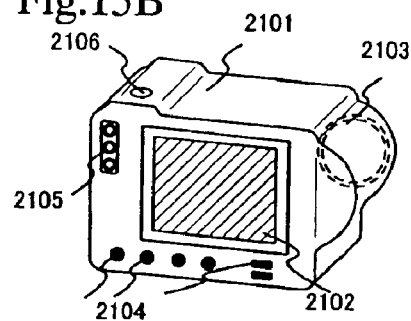

FIG. 15B illustrates a digital still camera which includes a main body 2101, a display portion 2102, an image receiving portion 2103, an operation key 2104, an external connection port 2105, a shutter 2106, and the like. It makes the digital still camera complete to apply the semiconductor device to the display portion 2102 or a circuit such as a signal processing circuit.

Figure 15C:
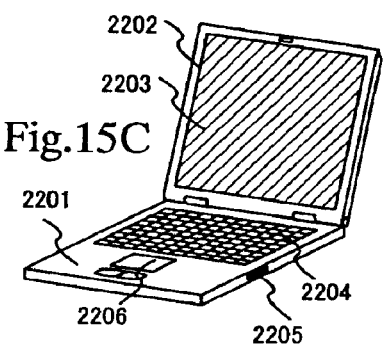

FIG. 15C illustrates a lap-top computer which includes a main body 2201, a casing 2202, a display portion 2203, a keyboard 2204, an external connection port 2205, a pointing mouse 2206, and the like. It makes the lap-top computer complete to apply the semiconductor device to the display portion 2203 or a circuit such as a signal processing circuit.

Figure 15D:
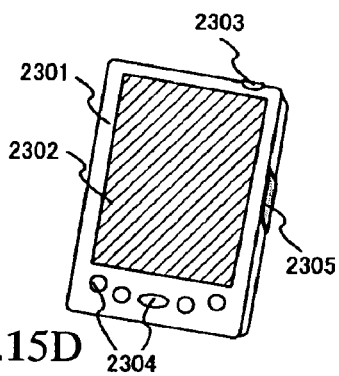

FIG. 15D illustrates a mobile computer which includes a main body 2301, a display portion 2302, a switch 2303, an operation key 2304, an infrared port 2305, and the like. It makes the mobile computer complete to apply the semiconductor device to the display portion 2302 or a circuit such as a signal processing circuit.

Figure 15E:
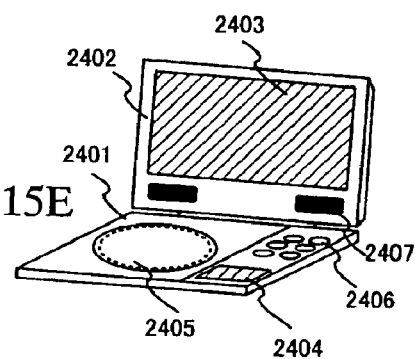

FIG. 15E illustrates a portable image reproduction device including a recording medium (specifically, a DVD reproduction device), which includes a main body 2401, a casing 2402, a display portion A 2403, another display portion B 2404, a recording medium (DVD or the like) reading portion 2405, an operation key 2406, a speaker portion 2407 and the like. The display portion A 2403 is used mainly for displaying image information, while the display portion B 2404 is used mainly for displaying character information. The image reproduction device including a recording medium further includes a game machine or the like. It makes the image reproduction device complete to apply the semiconductor device to the display portion A 2403 and the display portion B 2404, or a circuit such as a signal processing circuit.

Figure 15F:
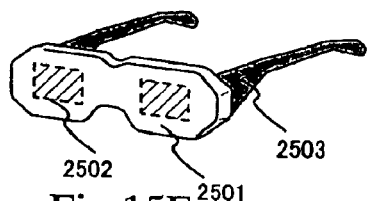

FIG. 15F illustrates a goggles-type display (head mounted display) which includes a main body 2501, a display portion 2502, arm portion 2503, and the like. It makes the goggles-type display complete to apply the semiconductor device to the display portion 2502 or a circuit such as a signal processing circuit.

Figure 15G:
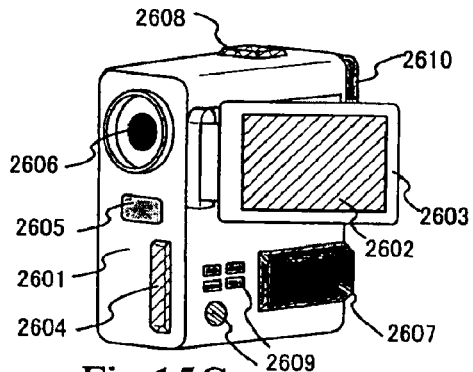

FIG. 15G illustrates a video camera which includes a main body 2601, a display portion 2602, a casing 2603, an external connecting port 2604, a remote control receiving portion 2605, an image receiving portion 2606, a battery 2607, a sound input portion 2608, an operation key 2609, a viewfinder 2610, and the like. It makes the video camera complete to apply the semiconductor device to the display portion 2602 or a circuit such as a signal processing circuit.

Figure 15H:
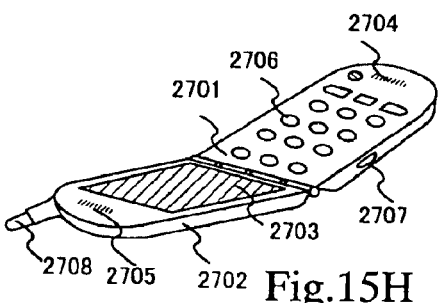
Figure 16:
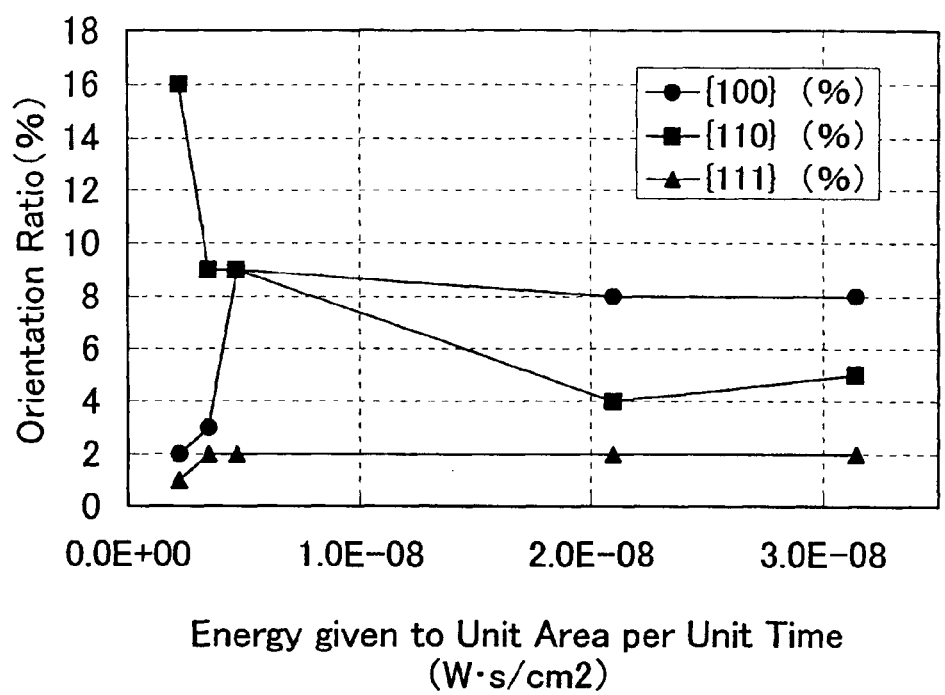
FIG. 16 is a figure showing the relation between energy given to unit area per unit time and an orientation ratio.

FIG. 15H illustrates a mobile telephone which includes a main body 2701, a casing 2702, a display portion 2703, a sound input portion 2704, a sound output portion 2705, an operation key 2706, an external connecting port 2707, an antenna 2708, and the like. It is noted that it makes the display portion 2703 reduce power consumption of the mobile telephone to display white-colored characters on a black-colored background. It makes the mobile phone complete to apply the semiconductor device to the display portion 2703 or a circuit such as a signal processing circuit.

As set forth above, the present invention can be applied widely to electronic apparatuses in various fields. The electronic apparatus in this embodiment may use a semiconductor device that has any of configurations shown in Embodiment 1 to 3.

In accordance with the present invention, it is possible to form separately a semiconductor film that has a high orientation ratio of {110} and a semiconductor film that has a high orientation ratio of {100} on the same substrate. Then, it is possible to improve not only mobility but also on-current of the respective TFTs without disturbing a high integration level when a p-channel TFT is formed of the semiconductor film that has a high orientation ratio of {110} and an n-channel TFT is formed of the semiconductor film that has a high orientation ratio of {100}.

TABLE 1

| Energy given to Unit Area per Unit Time (W · s/cm2) | Energy (W) | Scan Speed (cm/s) | {100} (%) | {110} (%) | {111} (%) |
|---|---|---|---|---|---|
| 3.1415900E−08 | 2 | 2 | 8 | 5 | 2 |
| 2.0944000E−08 | 2 | 3 | 8 | 4 | 2 |
| 4.7123900E−09 | 3 | 20 | 9 | 9 | 2 |
| 3.5185800E−09 | 5.6 | 50 | 3 | 9 | 2 |
| 2.2340200E−09 | 6.4 | 90 | 2 | 16 | 1 |

What is claimed is:

1. A method of manufacturing a semiconductor device comprising a p-channel TFT comprising a first island-shaped semiconductor film and an n-channel TFT comprising a second island-shaped semiconductor film, the method comprising:

adding a catalytic element to a semiconductor film;

heating the semiconductor film to form a crystallized first region and a less crystallized second region than the first region;

irradiating first laser light to the first region to form a more crystallized third region than the first region;

irradiating second laser light to the second region to form a more crystallized fourth region than the second region; and patterning the third region and the fourth region to form the first island-shaped region and the second island-shaped region, respectively, wherein the first laser light has the same energy density from second laser light, and wherein a scan speed of the first laser light is faster than that of the second laser light.

2. A method of manufacturing a semiconductor device according to claim 1, wherein a scan speed of the first laser light is over 20 cm/sec and less then 2000 cm/sec.

3. A method of manufacturing a semiconductor device according to claim 1, wherein a scan speed of the second laser light is more than 1 cm/sec and less then 20 cm/sec.

4. A method of manufacturing a semiconductor device according to claim 1, wherein each of the first laser light and the second laser light is a kind or a plurality of kinds selected from the group consisting of YAG laser, $YVO_4$ laser, YLF laser, $YAlO_3$ laser, glass laser, ruby laser, alexandrite laser, Ti: sapphire laser, and $Y_2O_3$ laser.

5. A method of manufacturing a semiconductor device according to claim 1, wherein each of the first laser light and the second laser light is emitted from continuous emission laser.

6. A method of manufacturing a semiconductor device according to claim 1, wherein each of the first laser light and the second laser light is second harmonic.

7. A method of manufacturing a semiconductor device comprising over a substrate a p-channel TFT comprising a first island-shaped semiconductor film and an n-channel TFT comprising a second island-shaped semiconductor film, the method comprising:

adding a catalytic element to a part of a semiconductor film;

heating the semiconductor film to form a first region in which a crystal grows in a parallel direction to the substrate and a less crystallized second region than the first region;

irradiating first laser light to the first region to form a more crystallized third region than the first region;

irradiating second laser light to the second region to form a more crystallized fourth region than the second region; and patterning the third region and the fourth region to form the first island-shaped region and the second island-shaped region, respectively, wherein the first laser light has the same energy density from second laser light, and wherein a scan speed of the first laser light is faster than that of the second laser light.

8. A method of manufacturing a semiconductor device according to claim 7, wherein a scan speed of the first laser light is over 20 cm/sec and less then 2000 cm/sec.

9. A method of manufacturing a semiconductor device according to claim 7, wherein a scan speed of the second laser light is more than 1 cm/sec and less then 20 cm/sec.

10. A method of manufacturing a semiconductor device according to claim 7, wherein each of the first laser light and the second laser light is a kind or a plurality of kinds selected from the group consisting of YAG laser, $YVO_4$ laser, YLF laser, $YAlO_3$ laser, glass laser, ruby laser, alexandrite laser, Ti: sapphire laser, and $Y_2O_3$ laser.

11. A method of manufacturing a semiconductor device according to claim 7, wherein each of the first laser light and the second laser light is emitted from continuous emission laser.

12. A method of manufacturing a semiconductor device according to claim 7, wherein each of the first laser light and the second laser light is second harmonic.

13. A method of manufacturing a semiconductor device comprising over a substrate a p-channel TFT comprising a first island-shaped semiconductor film and an n-channel TFT comprising a second island-shaped semiconductor film, the method comprising:

adding a catalytic element to a part a surface of a semiconductor film;

heating the semiconductor film to form a first region in which a crystal grows in a perpendicular direction to the substrate and a less crystallized second region than the first region;

irradiating first laser light to the first region to form a more crystallized third region than the first region;

irradiating second laser light to the second region to form a more crystallized fourth region than the second region; and patterning the third region and the fourth region to form the first island-shaped region and the second island-shaped region, respectively.

wherein the first laser light has the same energy density from second laser light, and wherein a scan speed of the first laser light is faster than that of the second laser light.

14. A method of manufacturing a semiconductor device according to claim 13, wherein a scan speed of the first laser light is over 20 cm/sec and less then 2000 cm/sec.

15. A method of manufacturing a semiconductor device according to claim 13, wherein a scan speed of the second laser light is more than 1 cm/sec and less then 20 cm/sec.

16. A method of manufacturing a semiconductor device according to claim 13, wherein each of the first laser light and the second laser light is a kind or a plurality of kinds selected from the group consisting of YAG laser, $YVO_4$ laser, YLF laser, $YAlO_3$ laser, glass laser, ruby laser, alexandrite laser, Ti: sapphire laser, and $Y_2O_3$ laser.

17. A method of manufacturing a semiconductor device according to claim 13, wherein each of the first laser light and the second laser light is emitted from continuous emission laser.

18. A method of manufacturing a semiconductor device according to claim 13, wherein each of the first laser light and the second laser light is second harmonic.

19. A method of manufacturing a semiconductor device comprising a p-channel TFT comprising a first island-shaped semiconductor film and an n-channel TFT comprising a second island-shaped semiconductor film, the method comprising:

irradiating first laser light to a first region of a semiconductor film to form a more crystallized third region than the first region;

irradiating second laser light to a second region of the semiconductor film which is different from the first region to form a more crystallized fourth region than the second region; and patterning the third region and the fourth region to form the first island-shaped region and the second island-shaped region, respectively, wherein energy that the second laser light gives to unit area per unit time is over than $4.7 \times 10^{-9}$ W·s/cm$^2$ and energy the first laser light gives to unit area per unit time is under $4.7 \times 10^{-9}$ W·s/cm$^2$.

20. A method of manufacturing a semiconductor device according to claim 19, wherein the energy that the second laser light gives to unit area per unit time is over than $4.7 \times 10^{-9}$ W·s/cm$^2$ and less than $3.1 \times 10^{-8}$ W·s/cm$^2$.

21. A method of manufacturing a semiconductor device according to claim 19, wherein the energy the first laser light gives to unit area per unit time is more than $2.2 \times 10^{-9}$ W·s/cm$^2$ and under $4.7 \times 10^{-9}$ W·s/cm$^2$.

22. A method of manufacturing a semiconductor device comprising a p-channel TFT comprising a first island-shaped semiconductor film and an n-channel TFT comprising a second island-shaped semiconductor film the method comprising:

adding a catalytic element to a semiconductor film;

heating the semiconductor film to form a crystallized first region and a less crystallized second region than the first region;

irradiating first laser light to the first region to form a more crystallized third region than the first region;

irradiating second laser light to the second region to form a more crystallized fourth region than the second region; and patterning the third region and the fourth region to form the first island-shaped region and the second island-shaped region, respectively, wherein the energy that the second laser light gives to unit area per unit time is over than $4.7 \times 10^{-9}$ W·s/cm$^2$ and energy the first laser light gives to unit area per unit time is under $4.7 \times 10^{-9}$ W·s/cm$^2$.

23. A method of manufacturing a semiconductor device according to claim 22, wherein the energy that the second laser light gives to unit area per unit time is over than $4.7 \times 10^{-9}$ W·s/cm$^2$ and less than $3.1 \times 10^{-8}$ W·s/cm$^2$.

24. A method of manufacturing a semiconductor device according to claim 22, wherein the energy the first laser light gives to unit area per unit time is more than $2.2 \times 10^{-9}$ W·s/cm$^2$ and under $4.7 \times 10^{-9}$ W·s/cm$^2$.

25. A method of manufacturing a secomiconductor device comprising over a substrate a p-channel TFT comprising a first island-shaped semiconductor film and an n-channel TFT comprising a second island-shaped semiconductor film, the method comprising:

adding a catalytic element to a part of a semiconductor film;

heating the semiconductor film to form a first region in which a crystal grows in a parallel direction to the substrate and a less crystallized second region than the first region;

irradiating first laser light to the first region to form a more crystallized third region than the first region;

irradiating second laser light to the second region to form a more crystallized fourth region than the second region; and patterning the third region and the fourth region to form the first island-shaped region and the second island-shaped region, respectively, wherein energy that the second laser light gives to unit area per unit time is over than $4.7 \times 10^{-9}$ W·s/cm$^2$ and energy the first laser light gives to unit area per unit time is under $4.7 \times 10^{-9}$ W·s/cm$^2$.

26. A method of manufacturing a semiconductor device according to claim 25, wherein the energy that the second laser light gives to unit area per unit time is over than $4.7 \times 10-9$ W·s/cm$^2$ and less than $3.1 \times 10^{-8}$ W·s/cm$^2$.

27. A method of manufacturing a semiconductor device according to claim 25, wherein the energy the first laser light gives to unit area per unit time is more than $2.2 \times 10^{-9}$ W·s/cm$^2$ and under $4.7 \times 10^{-9}$ W·s/cm$^2$.

28. A method of manufacturing a semiconductor device comprising over a substrate a p-channel TFT comprising a first island-shaped semiconductor film and an n-channel TFT comprising a second island-shaped semiconductor film, the method comprising:

adding a catalytic element to a part a surface of a semiconductor film;

heating the semiconductor film to form a first region in which a crystal grows in a perpendicular direction to the substrate and a less crystallized second region than the first region;

irradiating first laser light to the first region to form a more crystallized third region than the first region;

irradiating second laser light to the second region to form a more crystallized fourth region than the second region; and patterning the third region and the fourth region to form the first island-shaped region and the second island-shaped region, respectively, wherein energy that the second laser light gives to unit area per unit time is over than $4.7 \times 10^{-9}$ W·s/cm$^2$ and energy the first laser light gives to unit area per unit time is under $4.7 \times 10^{-9}$ W·s/cm$^2$.

29. A method of manufacturing a semiconductor device according to claim 28, wherein the energy that the second laser light gives to unit area per unit time is over than $4.7 \times 10^{-9}$ W·s/cm$^2$ and less than $3.1 \times 10^{-8}$ W·s/cm$^2$.

30. A method of manufacturing a semiconductor device according to claim 28, wherein the energy the first laser light gives to unit area per unit time is more than $2.2 \times 10^{-9}$ W·s/cm$^2$ and under $4.7 \times 10^{-9}$ W·s/cm$^2$.

* * * * *

UNITED STATES PATENT AND TRADEMARK OFFICE
CERTIFICATE OF CORRECTION

PATENT NO. : 6,908,797 B2
DATED : June 21, 2005
INVENTOR(S) : Tamae Takano

It is certified that error appears in the above-identified patent and that said Letters Patent is hereby corrected as shown below:

Column 2,
Line 36, replace "ration" with -- ratio --.

Column 4,
Lines 35 and 37, replace "ration" with -- ratio --.

Column 5,
Lines 46 and 58, replace "ration" with -- ratio --.

Signed and Sealed this

Thirtieth Day of May, 2006

JON W. DUDAS
*Director of the United States Patent and Trademark Office*